(12) United States Patent
Zhang et al.

(10) Patent No.: US 11,295,985 B2
(45) Date of Patent: Apr. 5, 2022

(54) FORMING A BACKSIDE GROUND OR POWER PLANE IN A STACKED VERTICAL TRANSPORT FIELD EFFECT TRANSISTOR

(71) Applicant: International Business Machines Corporation, Armonk, NY (US)

(72) Inventors: Chen Zhang, Albany, NY (US); Tenko Yamashita, Schenectady, NY (US); Kangguo Cheng, Schenectady, NY (US); Lawrence A. Clevenger, Saratoga Springs, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 77 days.

(21) Appl. No.: 16/293,166

(22) Filed: Mar. 5, 2019

(65) Prior Publication Data

US 2020/0286793 A1 Sep. 10, 2020

(51) Int. Cl.
| | |
|---|---|
| *H01L 21/336* | (2006.01) |
| *H01L 21/8234* | (2006.01) |
| *H01L 29/66* | (2006.01) |
| *H01L 29/78* | (2006.01) |

(52) U.S. Cl.
CPC ........ *H01L 21/823487* (2013.01); *H01L 21/823475* (2013.01); *H01L 29/66795* (2013.01); *H01L 29/7827* (2013.01)

(58) Field of Classification Search
CPC ......... H01L 21/823885; H01L 27/0688; H01L 27/092; H01L 29/1037; H01L 29/66666; H01L 29/7827; H01L 29/78642
See application file for complete search history.

(56) References Cited

U.S. PATENT DOCUMENTS

| | | | |
|---|---|---|---|
| 6,424,007 B1 | 7/2002 | Disney | |
| 6,770,534 B2 | 8/2004 | Cho et al. | |
| 7,683,428 B2 | 3/2010 | Chidambarrao et al. | |
| 9,680,473 B1 | 6/2017 | Anderson et al. | |
| 9,761,712 B1 | 9/2017 | Anderson et al. | |
| 9,824,933 B1 | 11/2017 | Pawlak | |
| 2006/0261406 A1 | 11/2006 | Chen | |
| 2009/0236658 A1 | 9/2009 | Gruening-Von Schwerin | |
| 2013/0221356 A1* | 8/2013 | Yamazaki | H01L 27/1207 257/57 |
| 2016/0240533 A1* | 8/2016 | Oxland | H01L 29/7827 |
| 2017/0243745 A1 | 8/2017 | Yilmaz | |
| 2018/0130900 A1 | 5/2018 | Usami | |

* cited by examiner

*Primary Examiner* — Meiya Li
(74) *Attorney, Agent, or Firm* — Amin, Turocy & Watson, LLP

(57) ABSTRACT

Techniques facilitating forming a backside ground or power plane in stacked vertical transport field effect transistor are provided. A semiconductor structure can include a first field effect transistor (FET). The semiconductor structure can also include a second FET. The first FET can be vertically stacked on a first surface of the second FET. The second FET can be electrically coupled to a conductive plane on a second surface of the second FET, the second surface being opposite to the first surface.

7 Claims, 20 Drawing Sheets

1800

1802
FORMING, IN A SEMICONDUCTOR STRUCTURE, A FIRST FIELD EFFECT TRANSISTOR (FET) VERTICALLY STACKED ON A FIRST SURFACE OF A SECOND FET

1804
ELECTRICALLY COUPLING THE SECOND FET TO A CONDUCTIVE PLANE ON A SECOND SURFACE OF THE SECOND FET, THE SECOND SURFACE BEING OPPOSITE TO THE FIRST SURFACE

FIG. 18

FORMING A BACKSIDE GROUND OR POWER PLANE IN A STACKED VERTICAL TRANSPORT FIELD EFFECT TRANSISTOR

BACKGROUND

The subject disclosure relates to semiconductor device structures and assembly, and more specifically, to vertical transistor devices and methods for making vertical transistor devices.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, devices, structures, computer-implemented methods, apparatuses, or computer program products that facilitate forming a backside ground or power plane in a stacked vertical transport field effect transistor, are provided.

According to an embodiment, a semiconductor structure can comprise a first field effect transistor (FET). The semiconductor structure can also comprise a second FET. The first FET can be vertically stacked on a first surface of the second FET. The second FET can be electrically coupled to a conductive plane on a second surface of the second FET, the second surface being opposite to the first surface.

Another embodiment relates to a method that can comprise forming, in a semiconductor structure, a first FET vertically stacked on a first surface of a second FET. The method can also comprise electrically coupling the second FET to a conductive plane on a second surface of the second FET, the second surface being opposite to the first surface.

Another embodiment relates to a method that can comprise forming, in a semiconductor structure, a first FET vertically stacked on a first surface of a second FET. The method can also comprise electrically coupling the second FET to a substrate layer on a second surface of the second FET, the second surface being opposite to the first surface. The method can further comprise replacing the substrate layer with a metallic ground plane.

These and other features will become apparent from the following detailed description of illustrative embodiments thereof, which is to be read in connection with the accompanying drawings.

13 during a fabrication stage where a dielectric material can be deposited into empty space left by the recessing of the conductive material, in accordance with one or more embodiments described herein.

Figure 7:
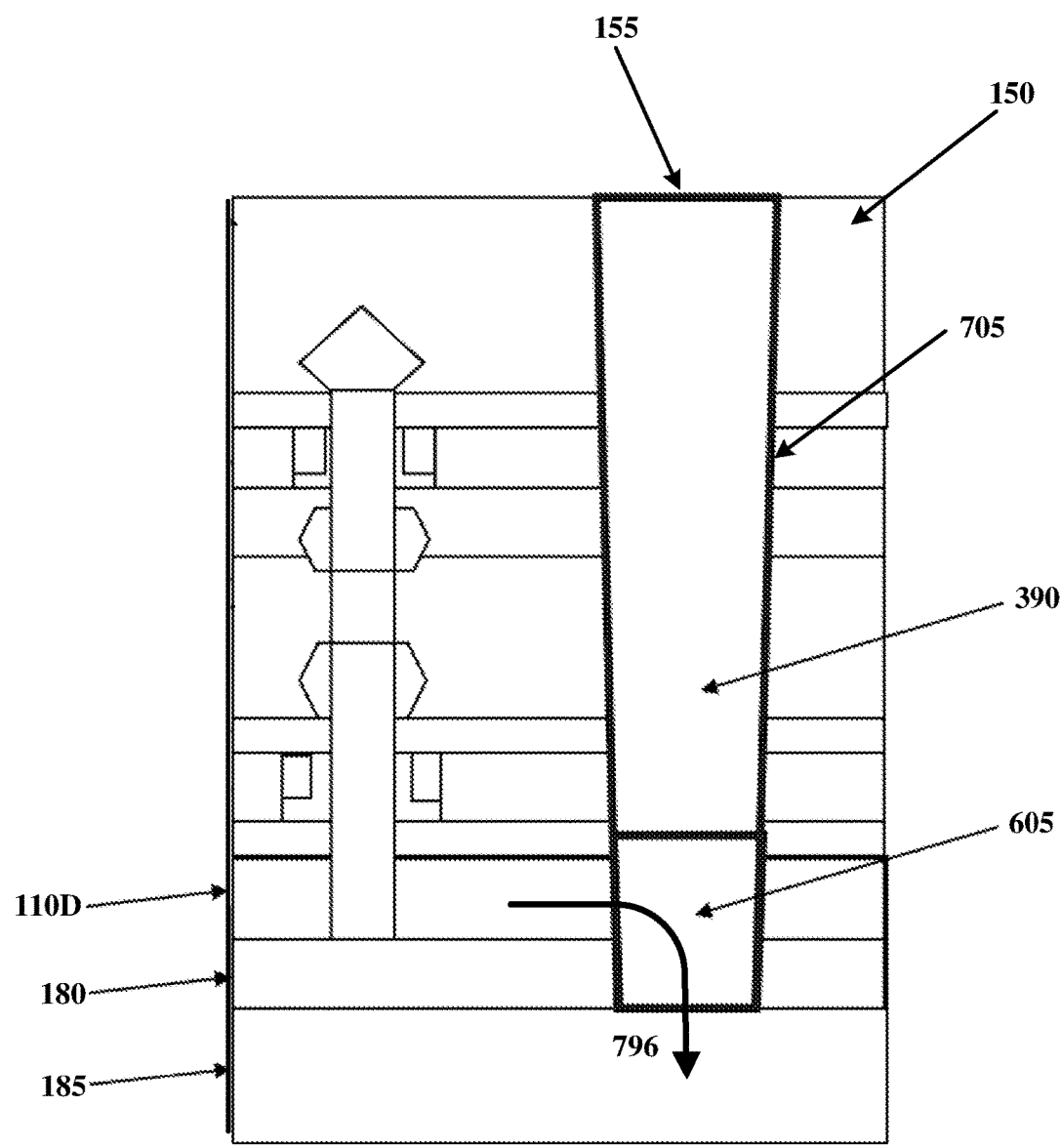
FIG. 7 illustrates an example, non-limiting, fin width cross-sectional view of the semiconductor structure of FIG. 6 during a fabrication stage where a dielectric material can be deposited into empty space left by the recessing of the conductive material, in accordance with one or more embodiments described herein.
Figure 15:
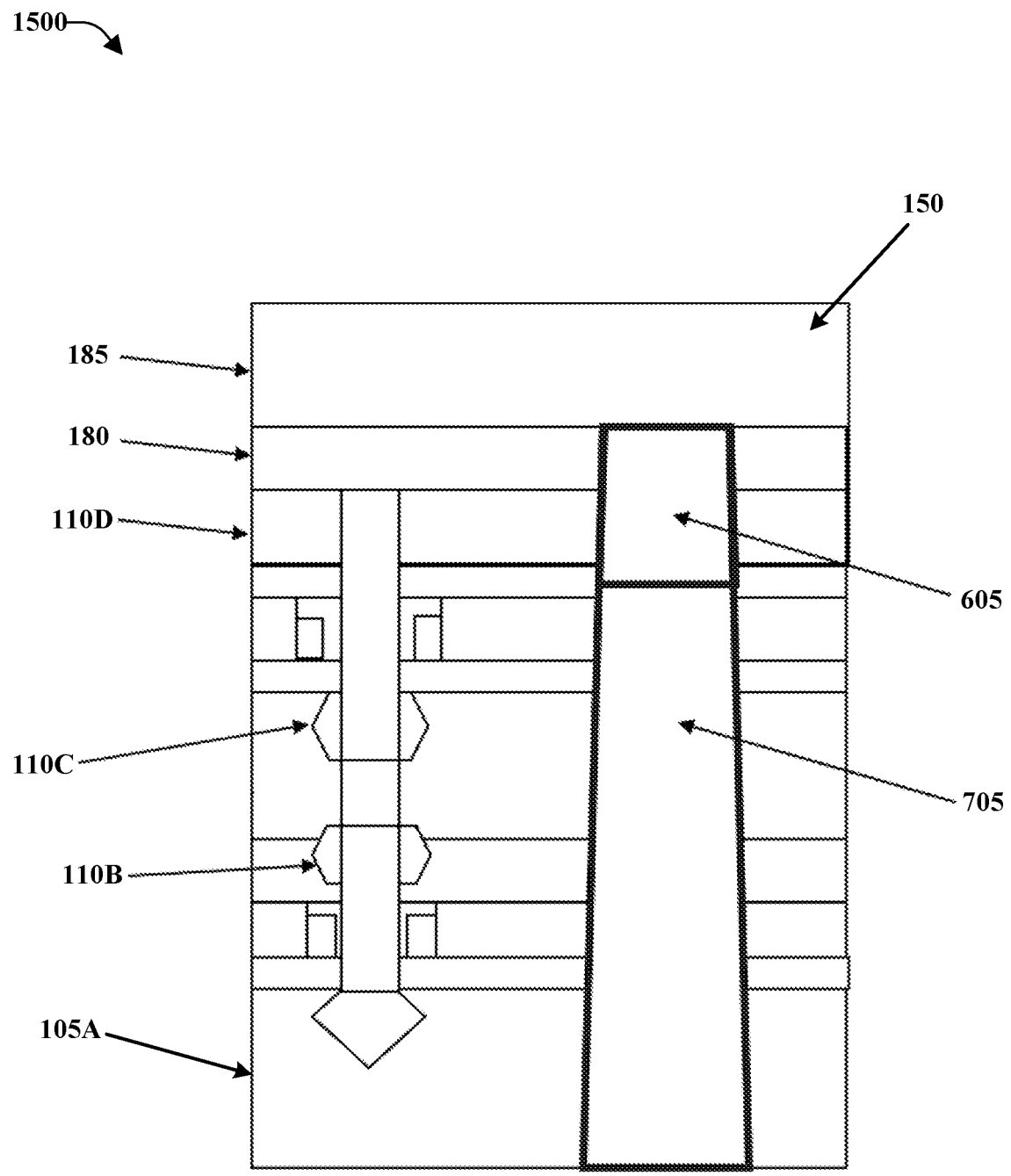

FIG. 15, for a third series of one or more embodiments, illustrates an inverted diagram of the example, non-limiting, fin width cross-sectional view of the semiconductor structure of FIG. 7, after the deposition of dielectric material to fill the empty space above remaining conductive material, as described in FIG. 7, in accordance with one or more embodiments described herein. Repetitive description of like elements employed in other embodiments described herein is omitted for sake of brevity.

Figure 16:
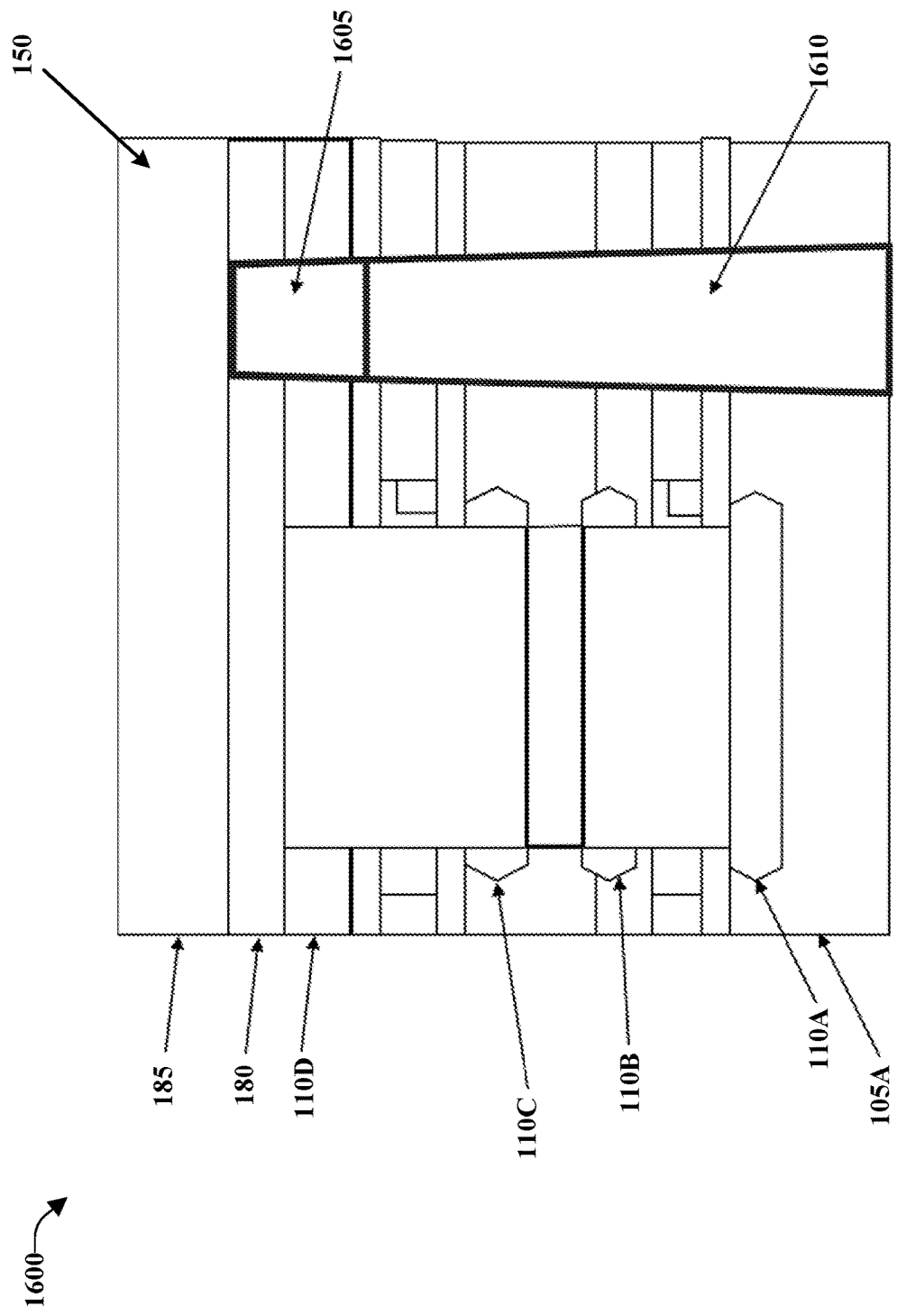

FIG. 16 illustrates a diagram of the example, non-limiting fin length cross-sectional view of a semiconductor structure similar to the semiconductor structure of FIG. 15, at a fabrication stage similar to the fabrication stage described in FIG. 15, in accordance with one or more embodiments described herein.

Figure 17:
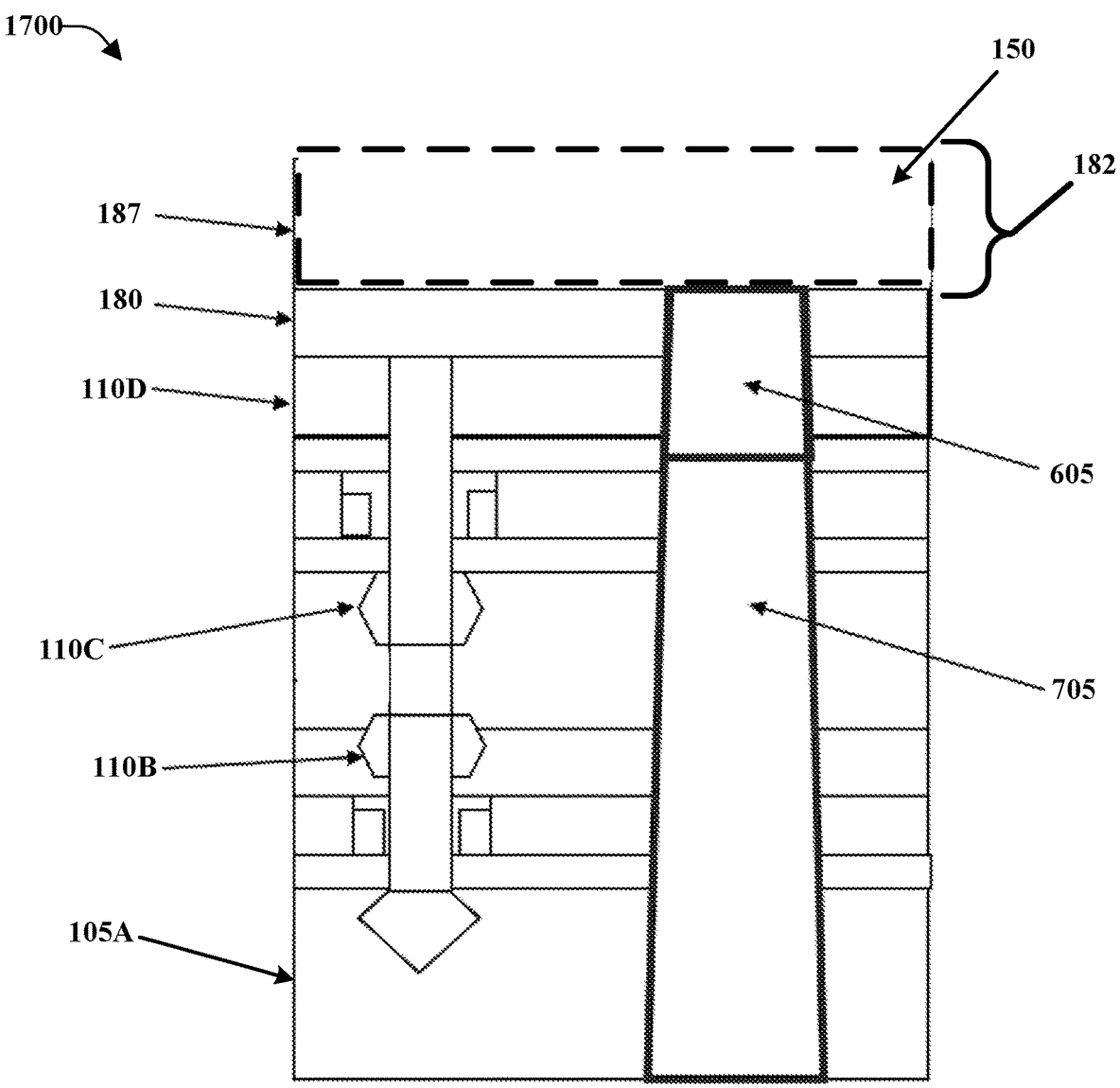

FIG. 17, illustrates a diagram of the example, non-limiting fin length cross-sectional view of the semiconductor structure of FIG. 16 during a fabrication stage where a substrate layer of semiconductor structure can be replaced by metallic layer, in accordance with one or more embodiments described herein. Repetitive description of like elements employed in other embodiments described herein is omitted for sake of brevity.

FIG. 18 illustrates a flow diagram of an example, non-limiting method for forming a backside ground or power plane in stacked vertical transport field effect transistor in accordance with one or more embodiments described herein.

Figure 19:
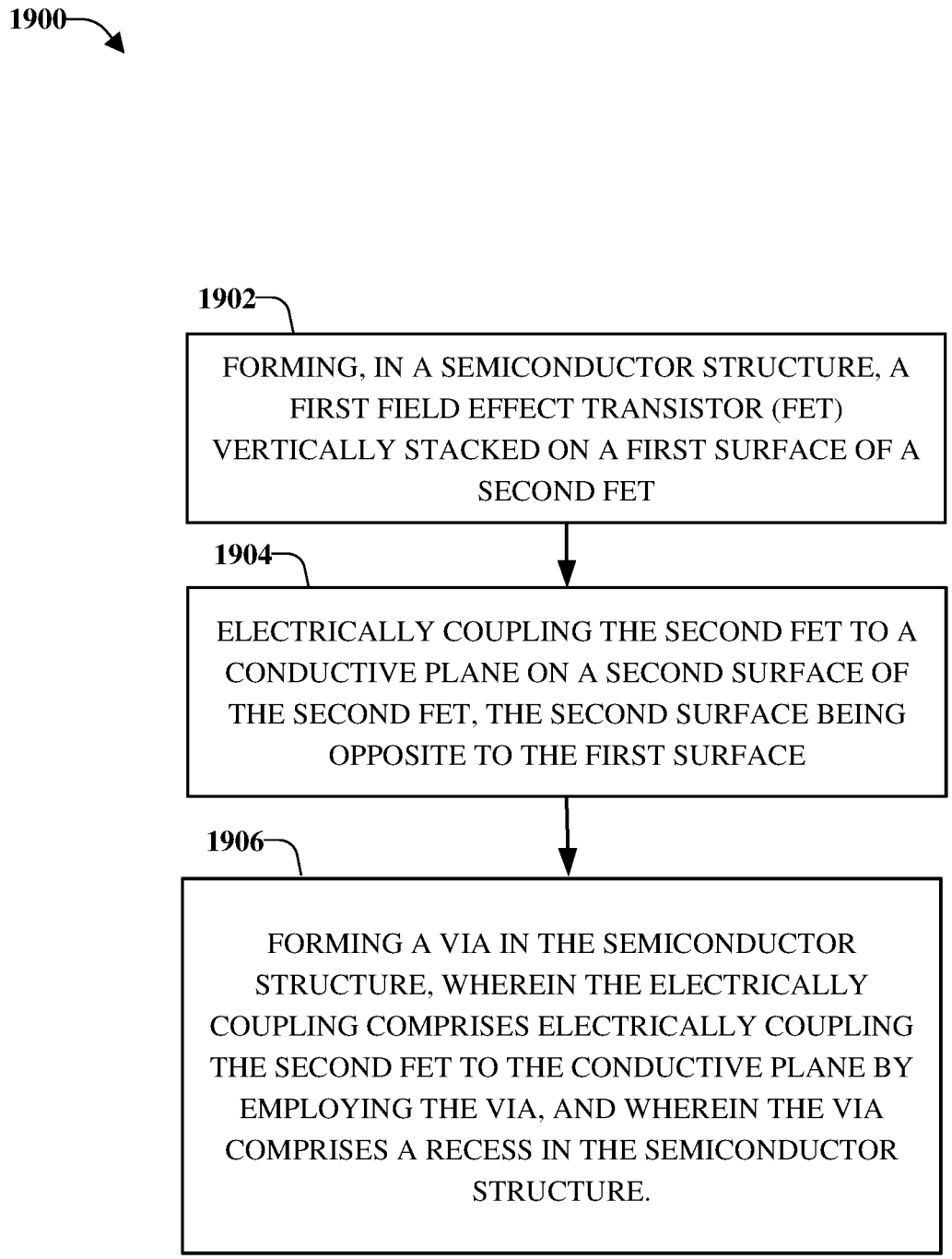

FIG. 19 illustrates a flow diagram of another example, non-limiting method for forming a backside ground or power plane in stacked vertical transport field effect transistor by employing a via in accordance with one or more embodiments described herein.

Figure 20:
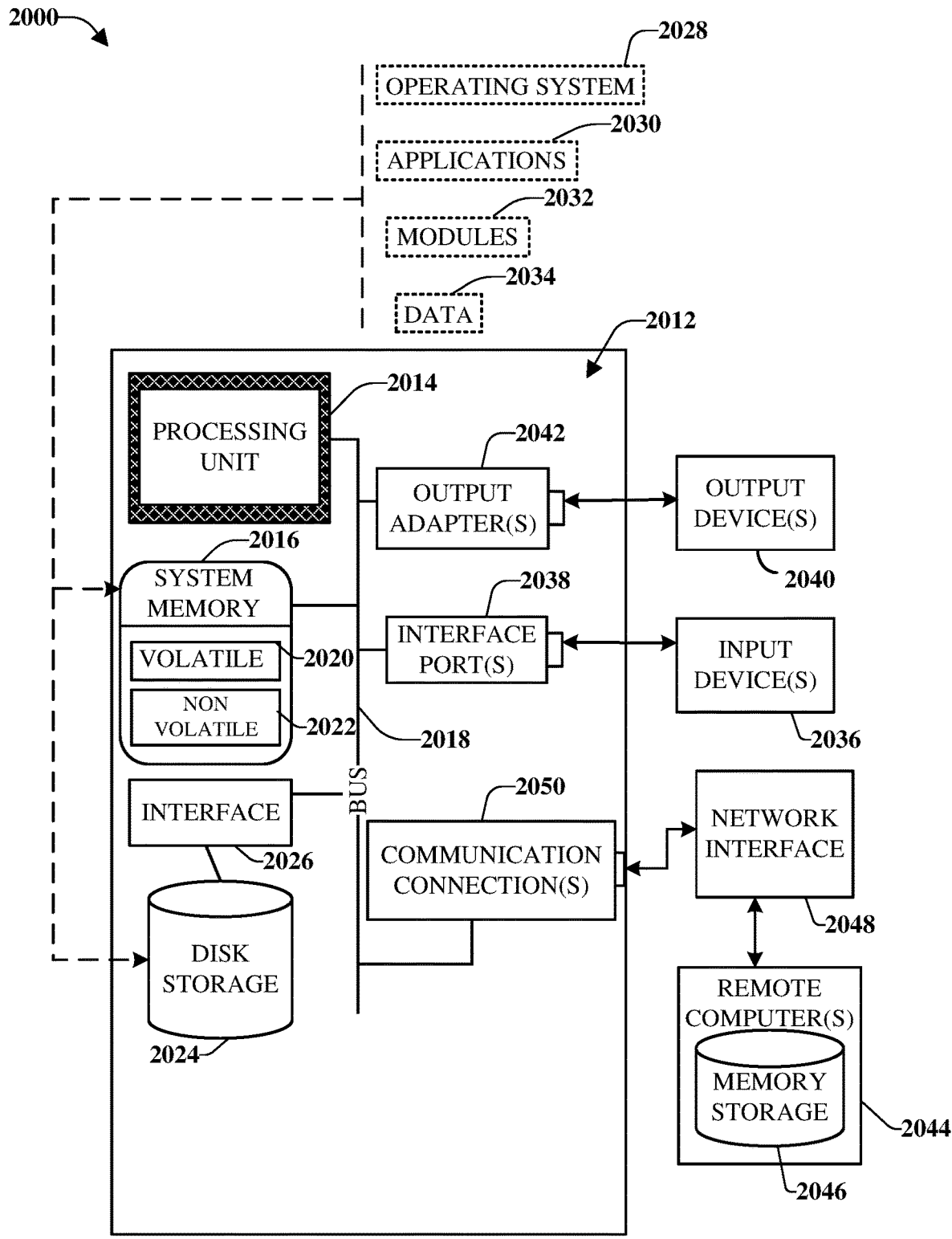

FIG. 20 illustrates a block diagram of an example, non-limiting operating environment in which one or more embodiments described herein can be facilitated.

DETAILED DESCRIPTION

The following detailed description is merely illustrative and is not intended to limit embodiments, application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

The various embodiments described herein relate to various embodiments of a semiconductor structure including stacked vertical transport field effect transistors (VTFETs) with a backside conductive plane, as well as forming and using the backside conductive plane in a VTFET.

A stacked VTFET can enable low track designs, e.g., stacking FETs can require less surface area for implementation, this smaller footprint being advantageous in certain designs. Disadvantages that can come from this smaller footprint can include, in some designs, a wireability problem, e.g., fitting inputs and outputs into the smaller area. In addition, the vertical stacking of components in the semiconductor structure can inhibit the connectivity of certain layers, e.g., when considering the higher density of components and the requirements of electrical insulation, some layers can be difficult to electrically couple with external components, e.g., lower layers in the semiconductor structure.

Generally speaking, placing a conductive plane for electric coupling on a backside of a VTFET semiconductor structure can provide additional options for semiconductor design, especially for vertically stacked FETS, e.g., by providing more space for interconnections with other components. One way of facilitating the placement of the conductive plane on the backside of semiconductor structure can be to use a via to form a channel for conductive material. In some circumstances, to enable a physical channel for a conductive link to electrically couple semiconductor components to a conductive plane, at fabrication a via can be used with sacrificial material. Another way to use a via to electrically couple semiconductor components is to form an insulator material on a conductive layer before the via is created. The via can be created through the insulator, and the conduit of conductive material created from the via can be insulated from interference.

Figure 1:
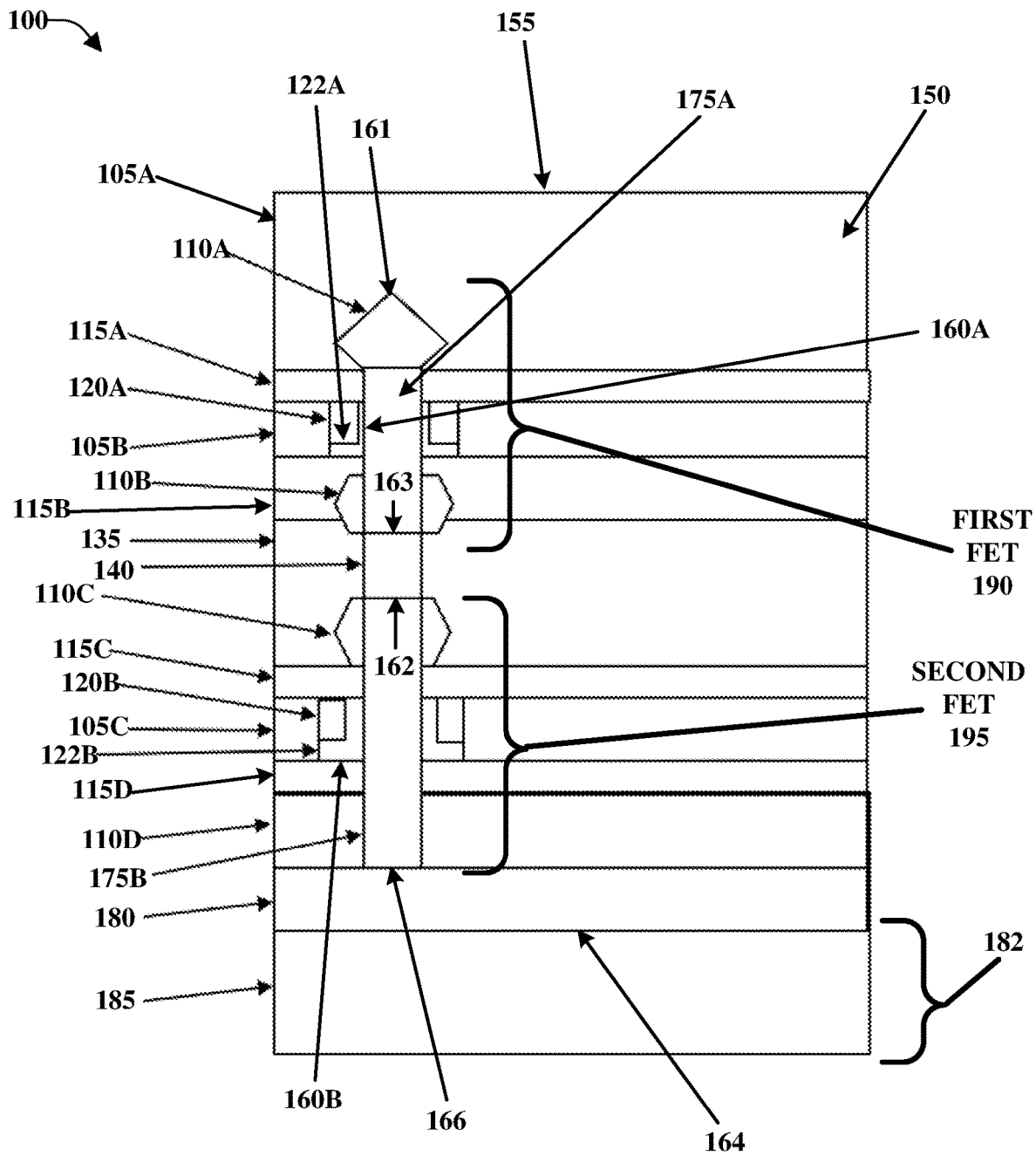
FIG. 1, for a first series of one or more embodiments, illustrates an example, non-limiting, fin width cross-sectional view of a semiconductor structure including a first FET and a second FET, in accordance with one or more embodiments described herein.

FIG. 1, for a series of one or more embodiments, illustrates an example, non-limiting fin width cross-sectional view 100 of semiconductor structure 150 including a first FET 190 and a second FET 195, in accordance with one or more embodiments described herein.

In one or more embodiments, semiconductor structure 150 can be formed a layer at a time starting at a substrate base layer and adding layers sequentially upwards. One approach to using a via as described above, can first form the layers of semiconductor structure 150 and then can form the via though the layers, e.g., by etching down into the layers. With FIG. 1, an example of an initial formation of semiconductor structure 150 without a via is described.

Substrate layer 185 can form the initial layer of semiconductor structure 150. It should be noted that FIGS. 1-17 depict a cross-sectional view of semiconductor structure 150, oriented with first surface 155 of semiconductor structure 150 being at the top of the figure as shown, and with substrate layer 185 on an opposite side. In one or more embodiments, the first surface 155 and second surface 164 of semiconductor structure 150 can correspond to the front side and backside (or back side) of semiconductor structure 150. As one or more embodiments described herein, a backside conductive plane can be a conductive plane, a surface of which is affixed to second surface 164 of semiconductor structure 150. In alternative embodiments, one or more additional layers can be located on a surface of the conductive plane that is opposite to the BOX layer 180, as discussed herein. An area corresponding to an example backside area 182 of semiconductor structure 150 is labeled in FIG. 1 to provide an example relative location of the backside relative to other structures of semiconductor structure. As depicted in FIG. 1, backside area 182 corresponds to substrate layer 185, but as described herein (e.g., with FIGS. 15-17 below) other typed of layers can be in this area.

Typically, the side opposite to the backside of the semiconductor structure 150 (e.g., the front side of the semiconductor structure 150) can also be termed the fabrication side, because this is where the fabrication of layers and components can be performed. With respect to representations of the orientation and relationship of components of semiconductor structure 150 shown in the drawings and described in the detailed description, it is important to note that, while the drawings or configuration descriptions may depict components stacked in a particular orientation, one or more embodiments can have the components described herein in any orientation, including, but not limited to, an inverted structure and a structure rotated to an angle. All such embodiments are envisaged and intended to be encompassed by the disclosures herein, e.g., the terms back and front are non-limiting of the orientation of one or more embodiments.

As described above, one or more embodiments can electrically couple layers of semiconductor structure 150 to a conductive plane on a backside of semiconductor structure 150. In one or more embodiments, substrate layer 185 can be the conductive plane referenced by some embodiments described herein. In this example, second surface 164 of semiconductor structure 150 can correspond to the backside of semiconductor structure 150. Depending on the type of layer coupled to substrate layer 185 by embodiments, substrate layer 185 can either function as a ground plane or a power plane. In examples of these arrangements, when second FET 195 is an NFET, substrate layer 185 can be a ground plane, and when second FET 195 is a PFET, substrate layer 185 can be a power plane, e.g., in an example, substrate layer 185 can be electrically connected respectively to ground, or a power supply voltage, in accordance with one or more embodiments.

In an alternative embodiment discussed with FIGS. 15-17 below, instead of substrate layer 185, a metallic layer can be affixed to second surface 164 of semiconductor structure 150. In the example described below with FIGS. 15-17, substrate layer 185 can be replaced by a metallic layer that can provide the conductive plane discussed in one or more embodiments herein.

Material used for substrate layer 185 can vary. In an aspect, substrate layer 185 can comprise a silicon wafer. According to another aspect, substrate layer 185 can comprise silicon dioxide affixed to a side of a silicon wafer. In another aspect, substrate layer 185 can comprise a compound semiconductor such as Indium gallium arsenide (InGaAs) or indium phosphide (InP).

Continuing the discussion of the formation of semiconductor structure 150, in one or more embodiments, a layered stack structure can be formed starting with substrate layer 185. The layered stack structure can comprise first VTFET and second VTFET, e.g., first FET 190 and second FET 195. According to some implementations, first FET 190 can be fabricated as stacked on first surface 162 of the second FET 195, e.g., first FET 190 formed on first surface 162 being the first surface of epitaxial layer 110C of second FET 195. One or more embodiments described herein can facilitate electrically coupling 796 second FET 195 to a conductive plane on a surface opposite to the first surface 162 of second FET 195, e.g., substrate layer 185 can be the conductive plane opposite to the first surface 162 of second FET 195.

The stacked VTFET design that can be used by one or more embodiments described herein, can include an NFET and a PFET stacked in either order. Namely, configurations are contemplated herein in which either the NFET or the PFET is present at the base and a side opposite the base of the stack. Thus, both NFET stacked on PFET and PFET stacked on NFET designs are described herein. Thus, as described herein second FET 195 can be either an NFET or a PFET, and first FET 190 can be either an NFET or a PFET.

Continuing the formation of semiconductor structure 150, in one or more embodiments, a buried insulator layer can be used to physically separate and electrically insulate second FET 195 from substrate layer 185. In one or more embodiments, as depicted in FIG. 1, an oxide can be deposited on substrate layer 185 to form a buried insulator layer termed a buried oxide (BOX) 185 layer. In one or more embodiments described herein, a conductive plane (e.g., substrate layer 185) can be on second surface 164 of semiconductor structure 150, e.g., a surface opposite to the first surface 162 of second FET 195.

Formed on a surface of BOX layer 180 opposite to substrate layer 185, a second source/drain (not shown) for second FET 195 can be patterned to surround the base of vertical fin channel 175B. The second source/drain can be in the form of second epitaxial layer 110D. Second epitaxial layer 110D can be formed, in one or more embodiments, by epitaxial growth of highly doped semiconductors. A second surface 166 of second FET 195 corresponds to a side of second epitaxial layer 110D affixed to BOX layer 180.

The polarity of the dopant (n-type or p-type) for the second epitaxial layer 110D can vary depending on whether second FET 195 is an NFET or PFET. For example, if second FET 195 is an NFET, example n-type dopants that can be used to create epitaxial layer 110C and second epitaxial layer 110D can include, but are not limited to, phosphorous or arsenic, and if second FET 195 is a PFET, suitable p-type dopants can include, but are not limited to, boron. In another example, phosphosilicate glass (PSG) can be also used as an n-type dopant and borosilicate glass (BSG) can be used as a p-type dopant.

Second FET 195 can include vertical fin channel 175B. Vertical fin channel 175B can be present between the second epitaxial layer 110D of second FET 195 and the epitaxial layer 110C of second FET 195.

To separate second epitaxial layer 110D from gate stacks 160B, second spacer 115D can be formed on second epitaxial layer 110D. Formed on second spacer 115D, third ILD 105C can include gate stacks 160B of second FET 195. The dielectric material for third ILD 105C can be, but is not limited to, a nitride-based material that can be used for isolation purposes. For example, third ILD 105C can be a determined depth (e.g., height), which can be the amount of space or isolation between second spacer 115D and first spacer 115C.

Gate stacks 160B can include a gate dielectric 122B and gate conductor 120B of the second VTFET, and can be formed alongside the vertical fin channel 175B and on second spacer 115D. In one or more embodiments, gate dielectric 122B can be composed of a high-κ dielectric. The term "high-κ" as used herein can refer to a material having a relative dielectric constant κ which can be much higher than that of silicon dioxide (e.g., a dielectric constant κ=25 for hafnium oxide rather than 4 for silicon dioxide). Suitable high-κ gate dielectrics can include, but are not limited to, hafnium oxide and lanthanum oxide.

In one or more embodiments, gate conductor 120B can be a metal gate, formed with gate conductor 120B being a metal or combination of metals. In one or more embodiments, the metal gate of gate conductor 120B can be composed of a workfunction metal (WFM). The particular WFM that can be employed can vary depending on whether second FET 195 is an NFET (n-type WFM) or PFET (p-type WFM). When the second FET 195 is an NFET, the WFM employed can be an n-type WFM. Suitable n-type WFMs can include, but are not limited to, titanium nitride, tantalum nitride or aluminum-containing alloys such as titanium aluminide, titanium aluminum nitride, titanium aluminum carbide, tantalum aluminide, tantalum aluminum nitride, or tantalum aluminum carbide. When the second FET 195 is a PFET, the WFM employed can be any p-type WFM. Suitable p-type WFMs can include, but are not limited to, titanium nitride, tantalum nitride, and tungsten.

Semiconductor structure 150 can include first spacer 115C between epitaxial layer 110C of second FET 195 and third ILD 105C. First spacer 115C can be patterned on gate stacks 160B and third ILD 105C of second FET 195. First spacer 115C can be patterned around vertical fin channel 175B. Suitable materials for the first spacer 115C can include, but are not limited to, silicon dioxide or silicon oxycarbide. FIGS. 8-14 below describe a series of embodiments where epitaxial layer 110C is electrically coupled to substrate layer 185.

Second FET 195 can include epitaxial layer 110C, with a first surface opposite to first spacer 115C being the first surface 162 of second FET 195. Epitaxial layer 110C can be formed by depositing dopant onto first spacer 115C alongside vertical fin channel 175B. Epitaxial layer 110C can serve as a dopant source for forming a first source/drain for second FET 195.

Semiconductor structure 150 can include isolation spacer 135 between second spacer 115B of first FET 190 and first spacer 115C of second FET 195. In one or more embodiments, isolation spacer 135 can surround second epitaxial layer 110B of first FET 190 and epitaxial layer 110C of second FET 195. Isolation spacer 135 can isolate second FET 195 from first FET 190 in accordance with one or more embodiments described herein. Isolation spacer 135 can be patterned above epitaxial layer 110C of second FET 195 around the vertical fin channel 175B. Suitable materials for isolation spacer 135 can include, but are not limited to, dielectric materials such as silicon nitride or silicon oxynitride.

Formed on isolation spacer 135, semiconductor structure 150 can further include first FET 190 vertically stacked (e.g., on second surface 163 of the first FET 190) on on second FET 195. First FET 190 can be formed over the second FET 195. First FET 190 can include vertical fin channel 175A. Vertical fin channel 175A can be present between the second epitaxial layer 110B and epitaxial layer 110A of first FET 190. Vertical fin channel 175B of second FET 195 can be separated from vertical fin channel 175A of the first VTFET by buried insulator layer 140.

Formation of the first FET 190 can proceed in the same general manner as with second FET 195, however, with a device of the opposite polarity being formed. For example, if second FET 195 is an NFET, then first FET 190 can be formed as a PFET, and if second FET 195 is a PFET, then first FET 190 can be formed as a NFET. In one or more embodiments, as discussed below, when second FET 195 is an NFET, substrate layer 185 can be a ground plane, and when second FET 195 is a PFET, substrate layer 185 can be a power plane.

First FET 190 can include second spacer 115B surrounding second epitaxial layer 110B of first FET 190. Second spacer 115B and second epitaxial layer 110B can form second surface 163 of first FET 190. Second spacer 115B can be patterned around vertical fin channel 175A. Suitable materials for second spacer 115B can include, but are not limited to, silicon dioxide or silicon oxycarbide.

Formed on second spacer 115B, first FET 190 can include second ILD 105B with gate stacks 160A of first FET 190. In a similar manner as third ILD 105C described above, the dielectric material for second ILD 105B can be a nitride-based material that can be used for isolation purposes. In one or more embodiments, second ILD 105B can be a determined depth (e.g., height), which can be the amount of space or isolation between second spacer 115B and the first spacer 115A.

In a similar manner as gate stacks 160B of third ILD 105C described above, gate stacks 160A can have parts including work function metal (WFM) 120A and high-k dielectric 122A.

First FET 190 can further include first spacer 115A between epitaxial layer 110A and second ILD 105B. In a similar manner as first spacer 115C of second FET 195, first spacer 115A can be patterned on second ILD 105B. Particularly, in one or more embodiments, first spacer 115A can be patterned on gate stacks 160A of second ILD 105B.

First FET 190 can include epitaxial layer 110A. In a similar manner to epitaxial layer 110C of second FET 195, epitaxial layer 110A can be formed by depositing dopant onto first spacer 115A alongside vertical fin channel 175A. Epitaxial layer 110A can serve as a dopant source for forming a first source/drain for first FET 190.

First FET 190 can include first interlayer dielectric (ILD) 105A of first FET 190. First ILD 105A of first FET 190 can be patterned on first spacer 115A around epitaxial layer 110A of first FET 190. First ILD 105A material can be deposited on first spacer 115A then and recessed to a determined depth. In one or more embodiments, stand lithography and etching techniques can be used to pattern first ILD 105A on the first spacer 115A. A directional etching process, such as reactive ion etching, can be used to pattern first ILD 105A. In one or more embodiments, a side of first ILD 105A can be the first surface 155 of semiconductor structure 150 and a side of epitaxial layer 110A opposite to second surface 163 of first FET 190 can be first surface 161 of first FET 190.

It should be noted that the embodiments discussed below can begin after the formation of semiconductor structure 150 described above. As would be appreciated by one having skill in the relevant art, given the disclosure herein, variations in materials, techniques of semiconductor fabrication, semiconductor structures, and semiconductor layers can be implemented without departing from the spirit of embodiments described herein.

As noted in the introduction above, some features of VTFET semiconductor structures can cause electrical coupling of layers to a conductive plane to be more difficult to implement. FIG. 1 illustrates some of these features by depicting the stacked structure of first FET 190 and second FET 195, and the potential for first FET 190 to obstruct electrical access by layers of second FET 195 to the first surface 115 of semiconductor structure 150.

Returning to a discussion of substrate layer 185 discussed above, it should be noted that, as depicted in FIG. 1, semiconductor structure 150 is depicted in a state of composition where substrate layer 185 is a part of semiconductor structure 150, affixed, in one or more embodiments, to second surface 164. One or more embodiments discussed below describe using different approaches to electrically couple substrate layer 185 to different layers of semiconductor structure 150. At the stage of composition depicted in the example of FIG. 1, although substrate layer 185 can still be a conductive plane, substrate layer 185 not yet electrically coupled to one or both of first FET 190 or second FET 195.

Figure 2:
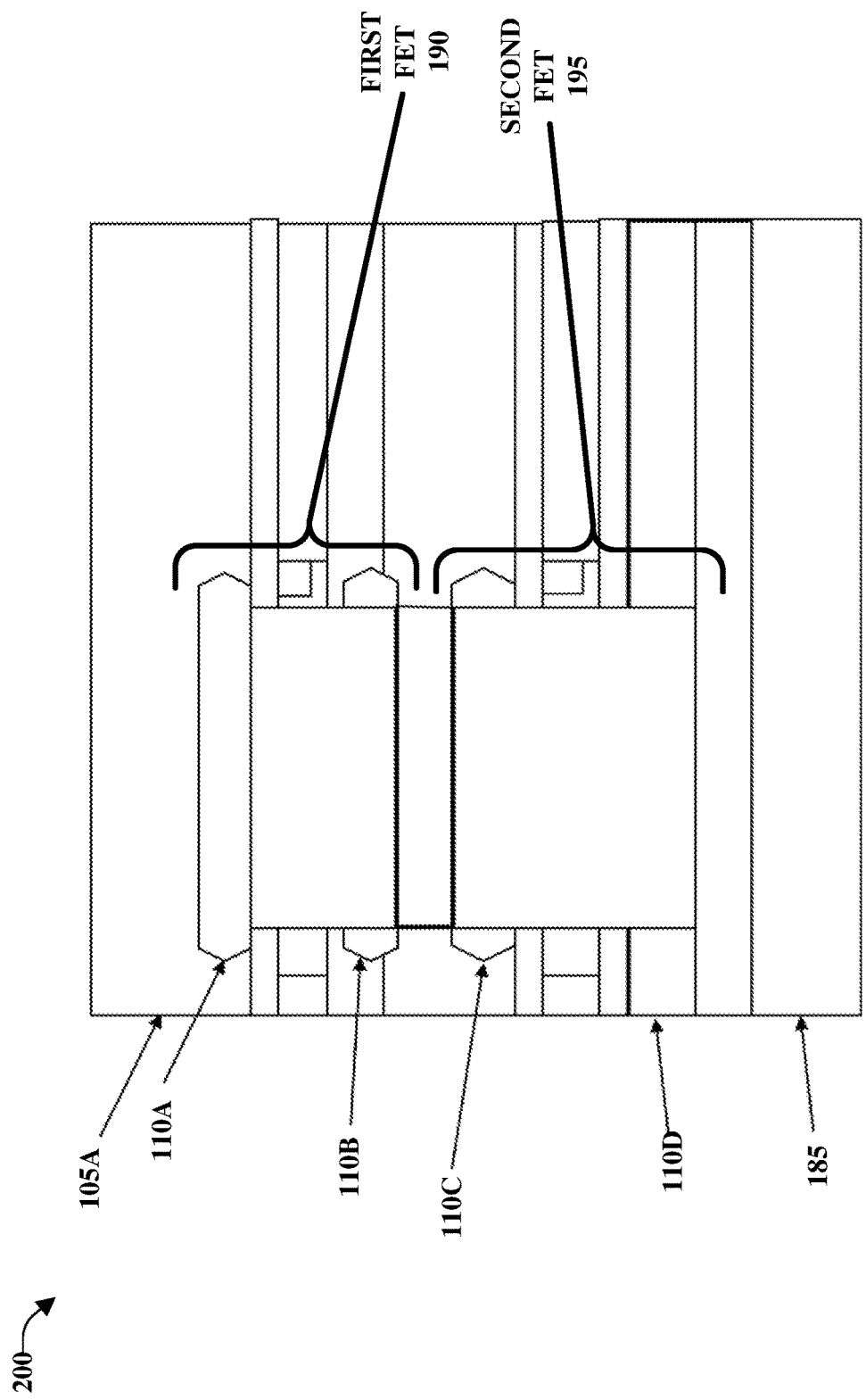
FIG. 2 illustrates an example, non-limiting fin length cross-sectional view of the example semiconductor structure described in FIG. 1, in accordance with one or more embodiments described herein.

FIG. 2 illustrates an example, non-limiting fin length cross-sectional view 200 of the example semiconductor structure 150 described in FIG. 1, in accordance with one or more embodiments described herein. Repetitive description of like elements employed in other embodiments described herein is omitted for sake of brevity.

Figure 3:
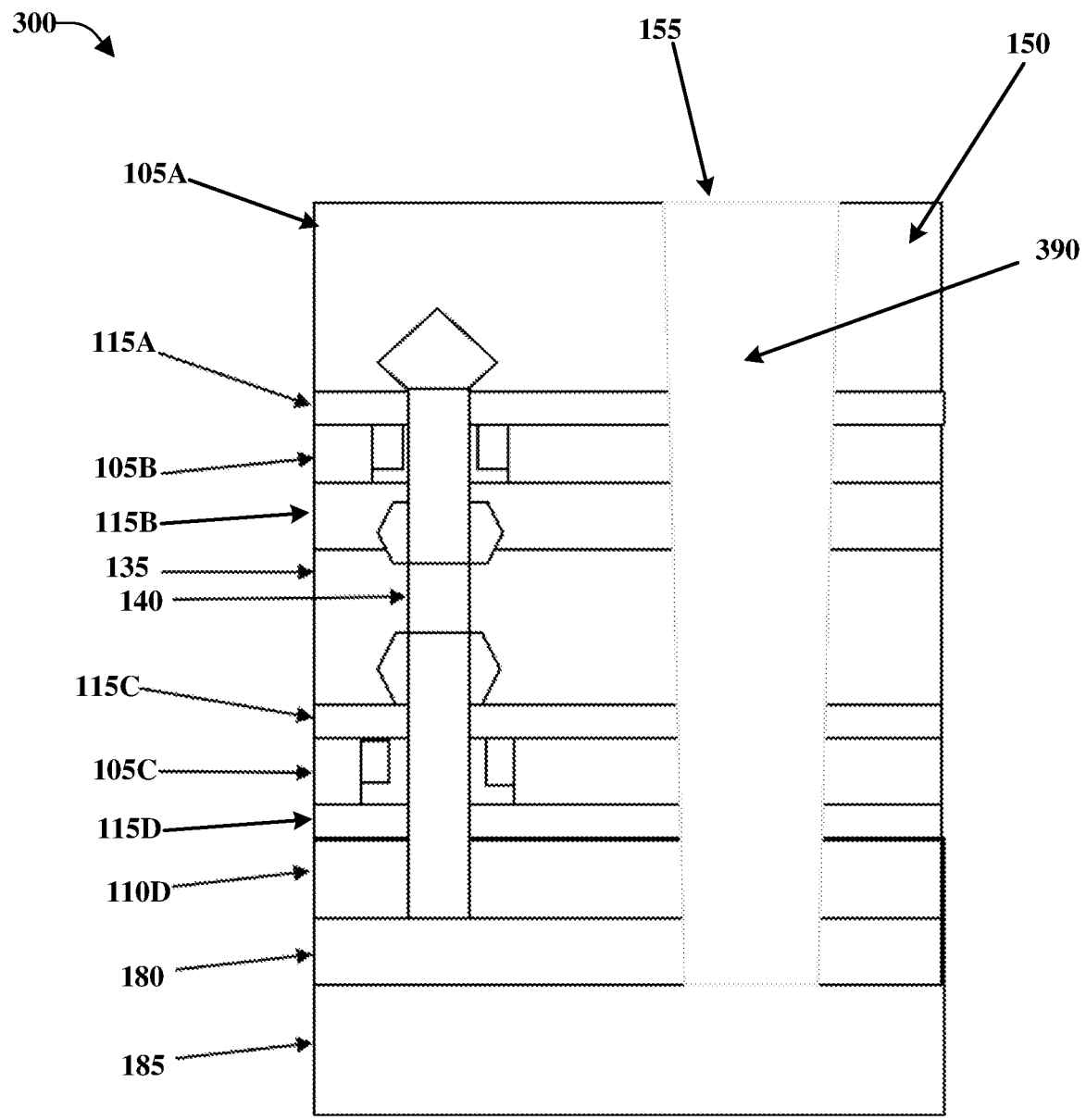
FIG. 3 illustrates an example, non-limiting, fin width cross-sectional view of the example semiconductor structure of FIG. 1 during a fabrication stage that can create a via from a surface of the semiconductor structure to a substrate layer of the semiconductor structure, in accordance with one or more embodiments described herein.
Figure 4:
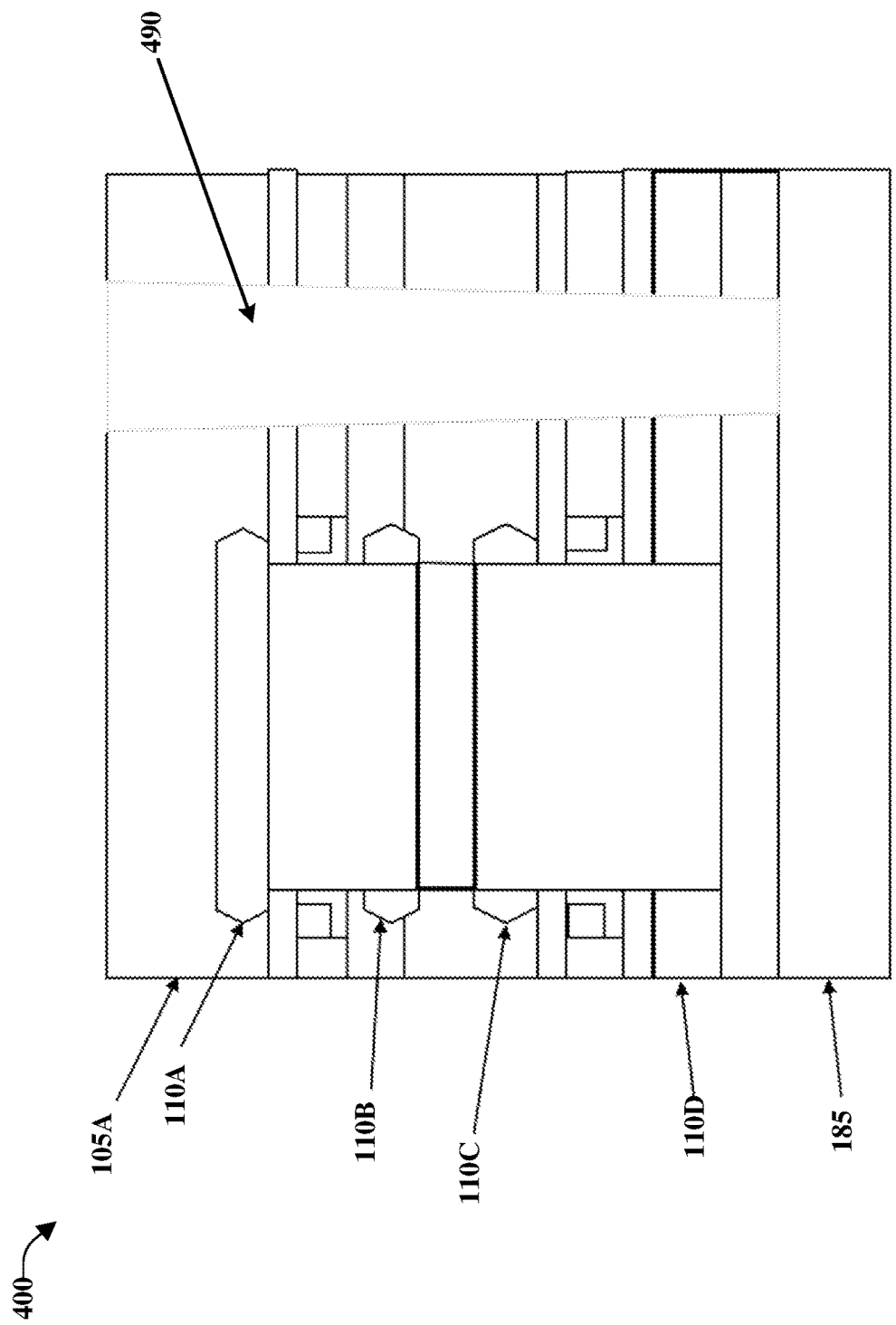
FIG. 4 illustrates an example, non-limiting fin length cross-sectional view of the example semiconductor structure of FIG. 2 during a fabrication stage similar to the stage described in FIG. 3, in accordance with one or more embodiments described herein.

With reference to the differences between FIGS. 1 and 2, it should be noted that FIGS. 1 and 2 are respectively fin width and fin length cross sectional diagrams of semiconductor structure 150. While FIG. 1 depicts the width side of semiconductor structure 150 and FIG. 2 depicts the length side, it should be appreciated that the embodiments described herein can be implemented with a via placed adjacent to the length end, as shown in FIG. 4 or with a via placed adjacent to the width end, as shown in FIG. 3 discussed below.

As noted above, with the stacked structure of VTFETs, some components can be obstructed by other components and thus have less options available for electrically coupling to a conductive plane. As detailed with FIGS. 3-17 below, one or more embodiments that can facilitate the placement of a conductive plane on the backside of semiconductor structure 150 can use a via created after an initial fabrication of the semiconductor structure.

FIGS. 3-7 discussed below are used to describe a series of embodiments that describe different composition processes that can be used by embodiments to electrically couple different components of semiconductor structure 150 to a backside conductive plane, e.g., a coupling between second epitaxial layer 110D of second FET 195 and substrate layer 185.

FIGS. 8-14 discussed below are used to describe a series of alternative embodiments that can use a sacrificial material to electrically couple a conductive plane to another example component of semiconductor structure 150, e.g., epitaxial layer 110C of second FET 195 electrically coupled to substrate layer 185, in accordance with one or more embodiments.

FIGS. 15-17 discussed below are used to describe another series of alternative embodiments. In contrast to the embodiments described with FIGS. 3-14 above, in the third series of embodiments, after electrically coupling components of semiconductor structure 150 to substrate layer 185, substrate layer 185 can be removed and replaced with a metallic layer, in accordance with one or more embodiments.

FIG. 3 illustrates an example, non-limiting, fin width cross-sectional view 300 of semiconductor structure 150 of FIG. 1 during a fabrication stage that can create a via 390 from the first surface 155 of semiconductor structure 150 to substrate layer 185 of semiconductor structure 150, in accordance with one or more embodiments described herein.

As described above, one approach to enabling an electrical coupling of components to substrate layer 185 is to make a via 390 in semiconductor structure 150 after it is initially fabricated (e.g., semiconductor structure 150 in the stage depicted in FIG. 1). As described in detail below, once via 390 is created, one or more embodiments can fill via 390 with conductive material. Once filled, the conductive material can be recessed, e.g., removing conductive material starting from first surface 155 of semiconductor structure 150, so that only a portion that can provide an electrical link between the components to be connected remains. In one or more embodiments, the free space above the remaining conductive material can be filled in with a dielectric material to prevent interference and otherwise prevent other material from entering via 390.

As depicted, in the example of FIG. 3, via 390 can be an inter-layer recess that starts at the first surface 155 of semiconductor structure 150 can traverse layers down, passing through first ILD 105A layer, first spacer 115A, second ILD 105B layer, second spacer 115B, isolation spacer 135, first spacer 115C, third ILD 105C layer, second spacer 115D, second epitaxial layer 110D, and BOX layer 180, and ending at substrate layer 185. It should be noted that different combinations of the same, additional, or fewer layers can also be traversed by via 390 without departing from the spirit of embodiments described herein.

In one or more embodiments, via 390 can be formed by patterning to remove a portion of semiconductor structure 150 to create a recess. Standard lithography and etching techniques can be used to pattern via 390. In one or more embodiments, a directional etching process such as reactive ion etching can be used for etching via 390. In an alternative to the placement of via 390 as depicted in FIG. 3, etching techniques, such as reactive ion etching noted above, can be used create via 390 with a deeper ending point. For example, instead of ending at substrate layer 185, via 390 can end partway through substrate layer 185 to a determined depth (not shown). In an alternative to the cutting down through layers approach to creating via 390, in one or more alternative embodiments, via 390 can be formed by using different approaches, e.g., using techniques to form the via spaces within layers as they are created.

At the end of the fabrication state depicted in FIG. 3, semiconductor structure can include first FET 190 stacked on second FET 195, and via 390 spanning from first surface 155 of semiconductor structure 150 to substrate layer 185.

FIG. 4 illustrates an example, non-limiting fin length cross-sectional view 400 of the example semiconductor structure 150 of FIG. 2, during a fabrication stage similar to the stage described in FIG. 3, in accordance with one or more embodiments described herein. Repetitive description of like elements employed in other embodiments described herein is omitted for sake of brevity.

Further to the discussion of FIG. 2 above regarding fin width and fin length cross-sections, it should also be noted that the fin width and fin length views of vias 390 and 490 respectively (e.g., FIGS. 3 and 4) are included to show example placements of a via in relation to the stacked VTFETs of semiconductor structure 150. For example, the different relative placements of vias 390 and 490 of FIGS. 3 and 4, do not have any substantial effects on the operation of the embodiments described herein. Notwithstanding the relative differences in dimensions between the examples of FIGS. 3 and 4 used to describe the above concepts, it should be noted that FIGS. 1-17, referenced by this description, are not intended to be drawn to scale, and should not be relied upon in this respect.

Figure 5:
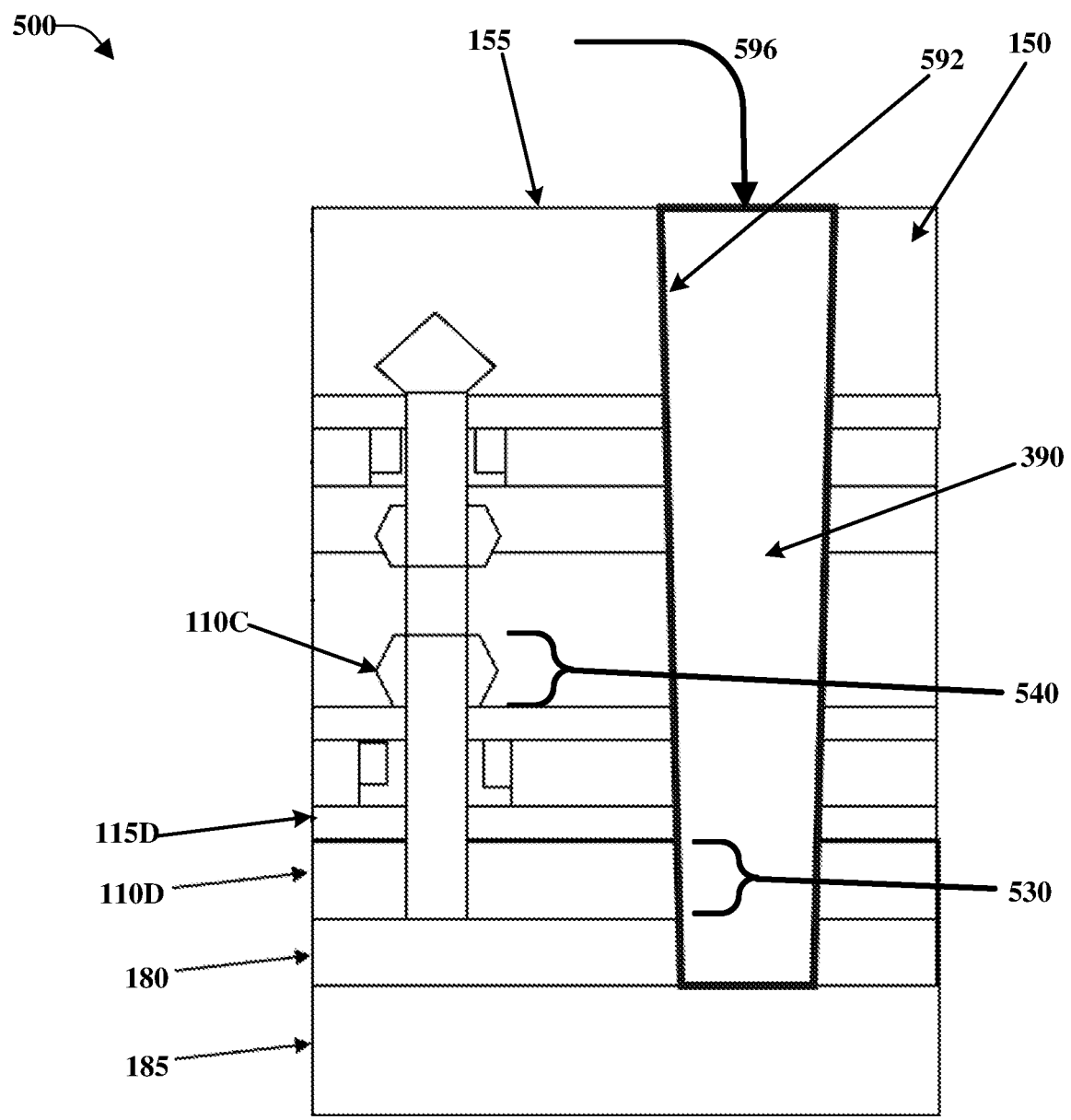
FIG. 5 illustrates an example, non-limiting, fin width cross-sectional view of the example semiconductor structure of FIG. 3 during a fabrication stage that can deposit conductive material into a via, in accordance with one or more embodiments described herein. Repetitive description of like elements employed in other embodiments described herein is omitted for sake of brevity.

FIG. 5 illustrates an example, non-limiting, fin width cross-sectional view 500 of the example semiconductor structure 150 of FIG. 3 during a fabrication stage that can deposit conductive material 592 into via 390, in accordance with one or more embodiments described herein. Repetitive description of like elements employed in other embodiments described herein is omitted for sake of brevity.

Figure 6:
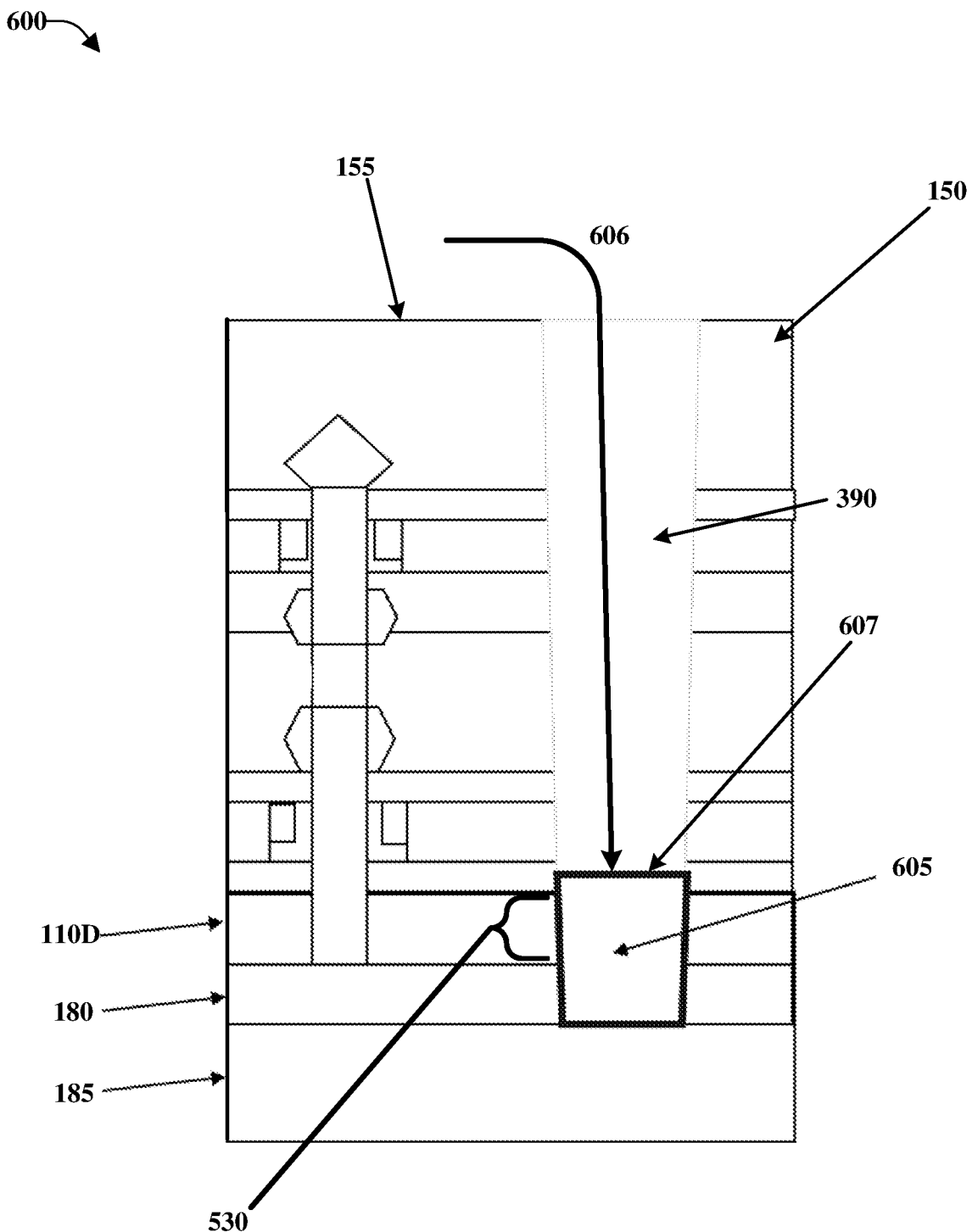
FIG. 6 illustrates an example, non-limiting, fin width cross-sectional view of the semiconductor structure of FIG. 5 during a fabrication stage where the conductive material can be recessed down until an electrical connection with the conductive surface of FIG. 5 is established, in accordance with one or more embodiments described herein.

In one or more embodiments, the fabrication stages depicted in FIGS. 5-7 facilitate the creation, using via 390 discussed with FIG. 3 above, of an electrical coupling between a layer of second FET 195 and a conductive plane. In the example depicted in FIG. 5, second epitaxial layer 110D of second FET 195 can be electrically coupled to a conductive plane, e.g. substrate layer 185.

Returning to the example depicted in FIG. 5, one approach to achieving the electrical coupling described above is to deposit 596 conductive material 592 to fill a portion or substantially all of via 390. In one or more embodiments, when conductive material 592 is a metal, this filling can be a metalization of via 390. Conductive material 592 can be a variety of materials including, but not limited to, indium-tin oxide, indium-zinc oxide, aluminum-zinc oxide, titanium, aluminum molybdenum, copper, cobalt, silver, gold, nickel, tungsten, chromium, hafnium, platinum, iron and their alloys.

Because, in the example depicted, the structure of second epitaxial layer 110D includes connectivity across the entire layer, and via 390 vertically traverses this layer, conductive material deposited in via 390 can be in contact with second epitaxial layer 110D, e.g., at conductive surface 530, where conductive material 592 can contact second epitaxial layer 110D.

It should be noted that, when an alternative element of semiconductor structure 150 is selected to be electrically connected using this approach, a connection between a conductive material in via 390 and the component can involve different approaches to establishing links between conductive material 592 and the element. For example, in an example embodiment discussed with FIGS. 8-14 below, epitaxial layer 110C is selected to be electrically connected to substrate layer 185. In contrast to the potential conductivity of conductive surface 530 of second epitaxial layer 110D, conductive surface 540 of epitaxial layer 110C is not, in the example shown in FIG. 5, in contact with via 390. Thus, conductive material 592 placed within via 390 to a level of epitaxial layer 110C would not be in contact with conductive surface 540. Additional examples, and approaches that can establish the electric coupling in this example are discussed below with FIGS. 8-14 below.

FIG. 6 illustrates an example, non-limiting, fin width cross-sectional view 600 of semiconductor structure 150 of FIG. 5 during a fabrication stage where conductive material 592 can be recessed down until an electrical connection with conductive surface 530 is established, in accordance with one or more embodiments described herein. Repetitive description of like elements employed in other embodiments described herein is omitted for sake of brevity.

In one or more embodiments, conductive material 592 can be recessed 606 down resulting in remaining conductive material 605. In one or more embodiments, conductive material 592 can be recessed to a point above conductive surface 530 and not in contact with other conductive layers, e.g., adjacent to second epitaxial layer 110D. As described in FIG. 7, this position for remaining conductive material 605 can facilitate electrically coupling 796 lower epitaxial layer 110D with substrate layer 185.

FIG. 7 illustrates an example, non-limiting, fin width cross-sectional view 700 of semiconductor structure 150 of FIG. 6 during a fabrication stage where dielectric material 705 can be deposited into empty space left by the recessing 606 of conductive material 592, in accordance with one or more embodiments described herein. Repetitive description of like elements employed in other embodiments described herein is omitted for sake of brevity.

Because of contact between remaining conductive material 605 and conductive surface 530 electrically coupling 796 is facilitated. In addition, because remaining conductive material 605 is not in contact with other conductive layers, electrically coupling 796 is facilitated because interference with electric coupling 796 can be reduced or removed.

In this example, because remaining conductive material 605 can be subject to interference based on empty space in via 390, in one or more embodiments, dielectric material 705 can be deposited into via 390 on 607 remaining conductive material 605 until dielectric material 705 reaches is substantially to first surface 155 of semiconductor structure 150.

In an alternative embodiment, dielectric material can be deposited into via 390 on 607 remaining conductive material 605, and continue to be deposited until dielectric material 705 reaches a point where a space is left below first surface 155 of semiconductor structure 150 (not shown). In this embodiment, dielectric material can act as a cap on remaining conductive material 605, such that additional, different types of materials can be deposited on dielectric material 705 to the first surface 155 of semiconductor structure 150. In an example, this additional material deposited can be a conductor, for example, in contact with dielectric material and other elements of second FET 195, e.g., epitaxial layers of first FET 190 (not shown). In one or more embodiments, this alternative use of dielectric material can act a cap over remaining conductive material 605 such that remaining conductive material 605 can be insulated from conductive material deposited above.

It should be appreciated that, for all of the fabrication techniques described herein, as semiconductor fabrication techniques advance, the structures created by one or more embodiments described herein may be able to be created by techniques not described herein.

Figure 8:
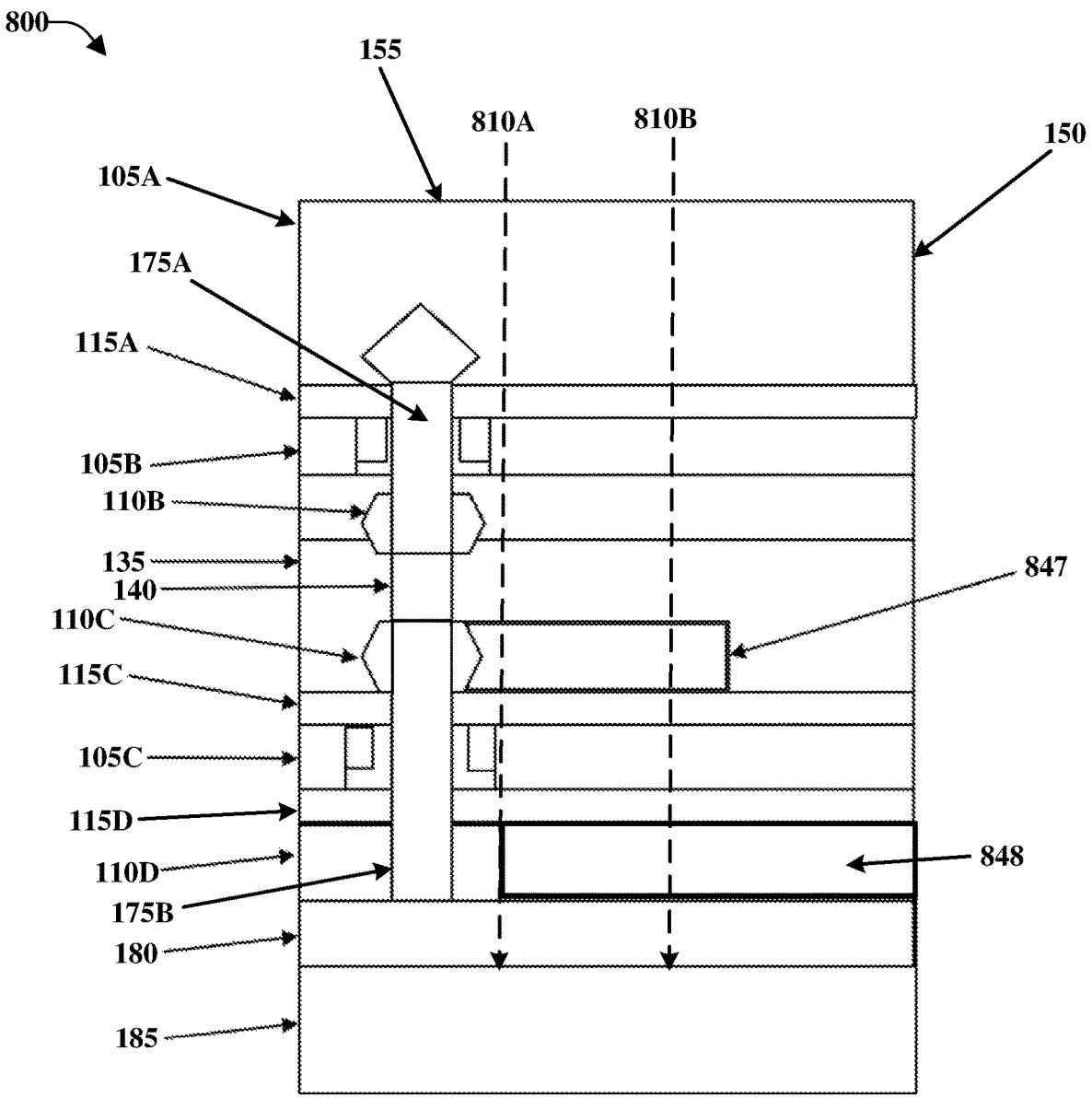
FIG. 8, for a second series of one or more embodiments, illustrates an example, non-limiting, fin width cross-sectional view of the semiconductor structure of FIG. 1, at a fabrication stage where a sacrificial material can be deposited adjacent to a first epitaxial layer of a second VTFET of the semiconductor structure, in accordance with one or more embodiments described herein.

FIG. 8, for a second series of one or more embodiments, illustrates an example, non-limiting, fin width cross-sectional view 800 of semiconductor structure 150 of FIG. 1, at a fabrication stage where, to electrically couple epitaxial layer 110C of second FET 195 to substrate layer 185, a sacrificial material can be deposited adjacent to epitaxial layer 110C of second FET 195, in accordance with one or more embodiments described herein. Repetitive description of like elements employed in other embodiments described herein is omitted for sake of brevity.

When using an approach similar to the approach discussed with FIGS. 3-7 above, alternative actions can be performed when different layers are sought to be connected with substrate layer 185. In an alternative embodiment, FIG. 8 depicts semiconductor structure 150, but in this example a different component is sought to be electrically coupled with substrate layer 185, e.g., epitaxial layer 110C.

As discussed further below, in this example, a via may not be able to be placed that can enable a connection with epitaxial layer 110C by the approach described above. Illustrating one of the reasons that epitaxial layer 110C may not be able to be electrically coupled using the previously described techniques, a straight via path, e.g., via path 810A, does not contact epitaxial layer 110C.

Figure 9:
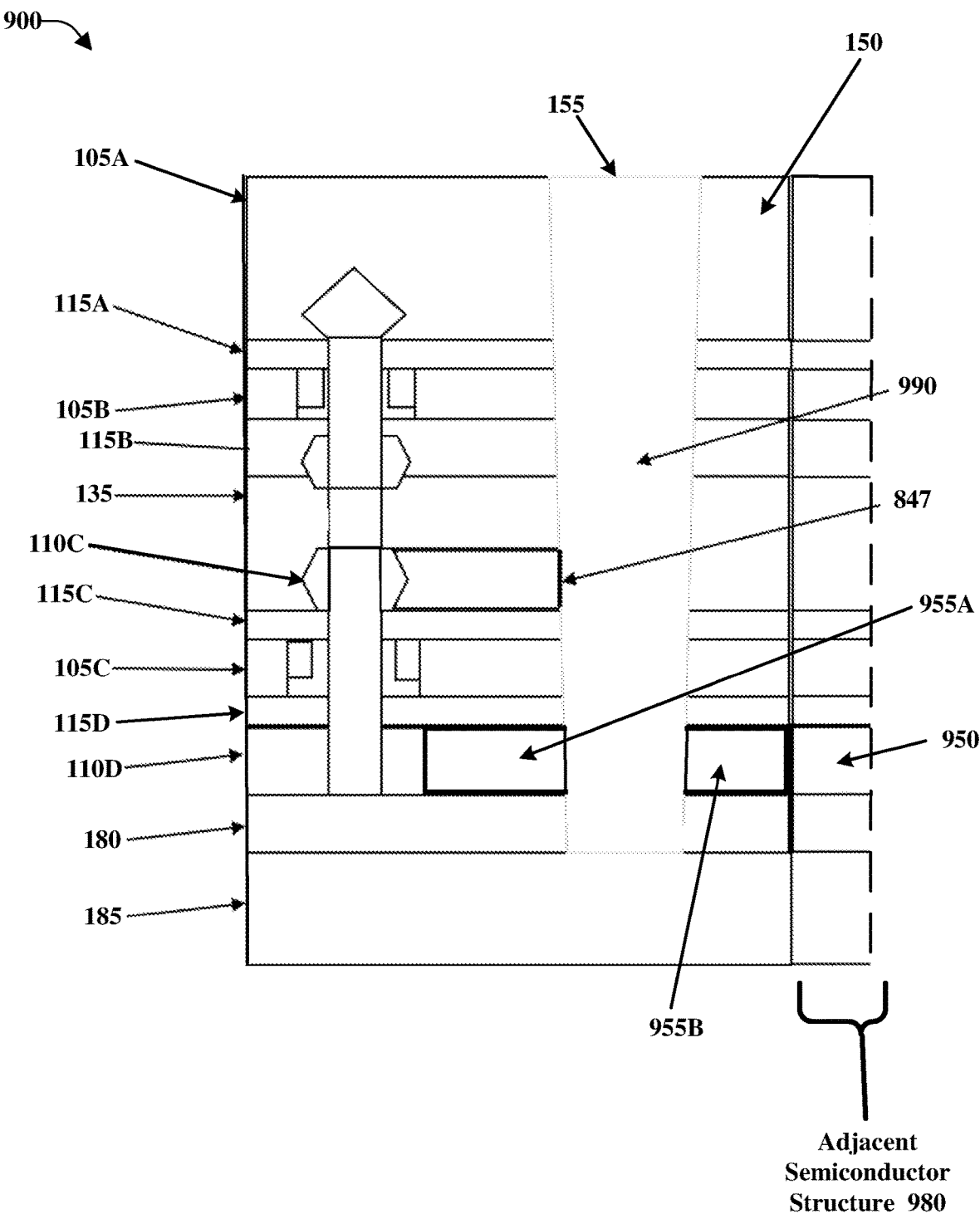
FIG. 9 illustrates an example, non-limiting, fin width cross-sectional view of the semiconductor structure of FIG. 8, during a fabrication stage where a via, similar to the via of FIG. 3, can be created from the surface of the semiconductor structure to the substrate layer of the semiconductor structure, the via being created, following a via path through a sacrificial material and an insulator described above with FIG. 8, in accordance with one or more embodiments described herein.
Figure 11:
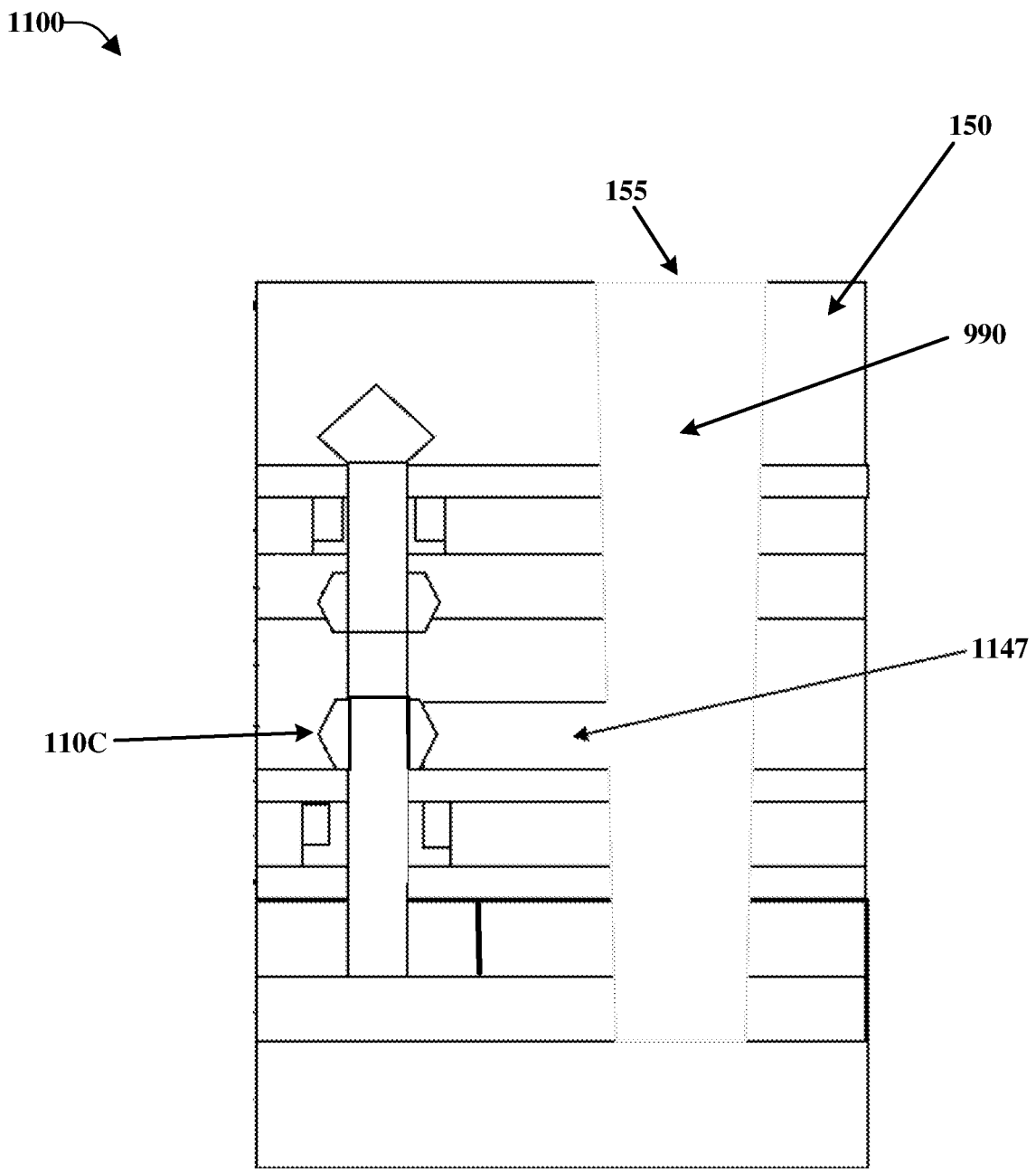
FIG. 11 illustrates an example, non-limiting, fin width cross-sectional view of the semiconductor structure of FIG. 9, during a fabrication stage where sacrificial material can be removed, in accordance with one or more embodiments described herein.
Figure 12:
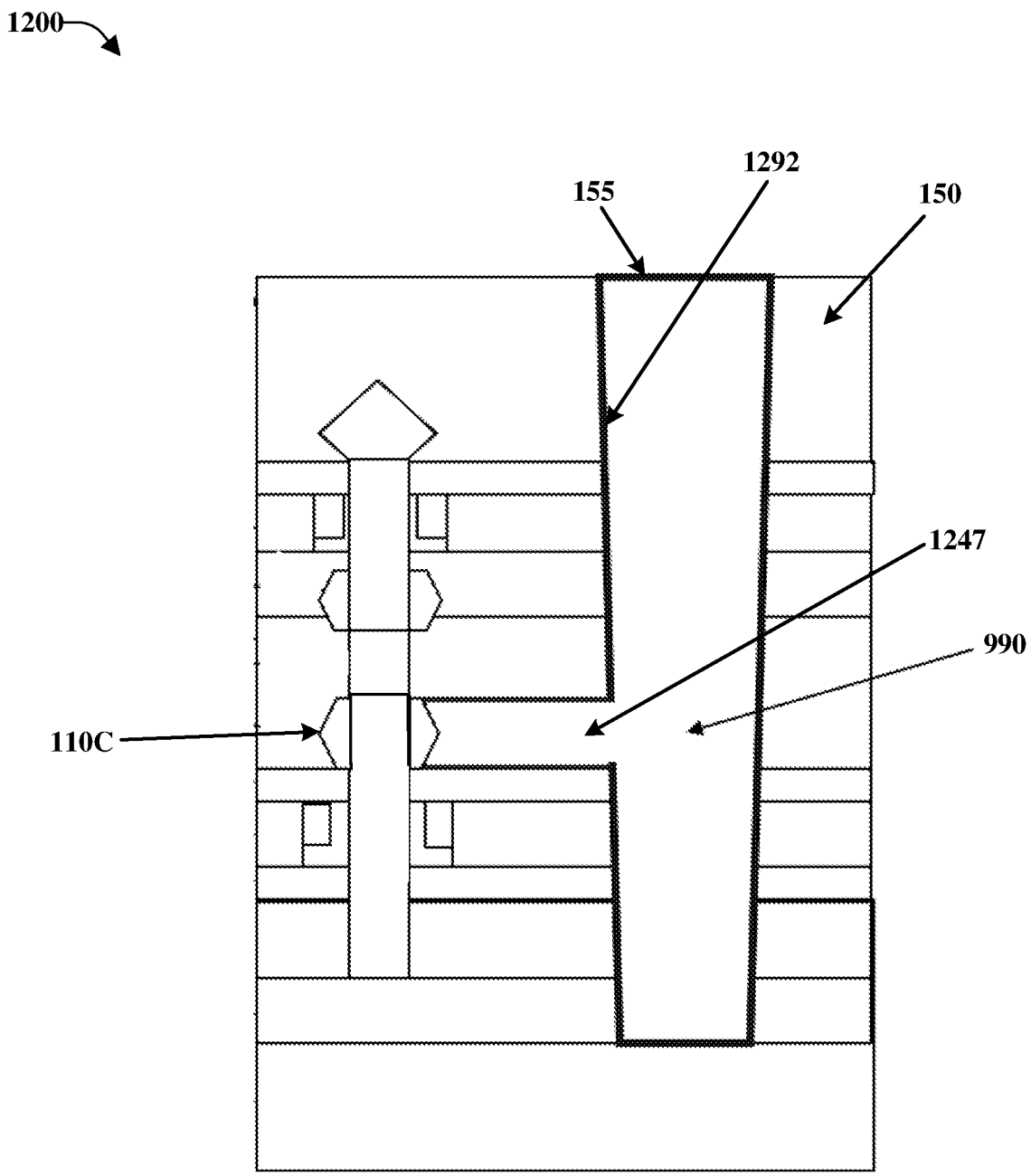
FIG. 12 illustrates an example, non-limiting, fin width cross-sectional view of the semiconductor structure of FIG. 11, during a fabrication stage where conductive material can be deposited substantially to the opening of the via described in FIG. 9, in accordance with one or more embodiments described herein.
Figure 13:
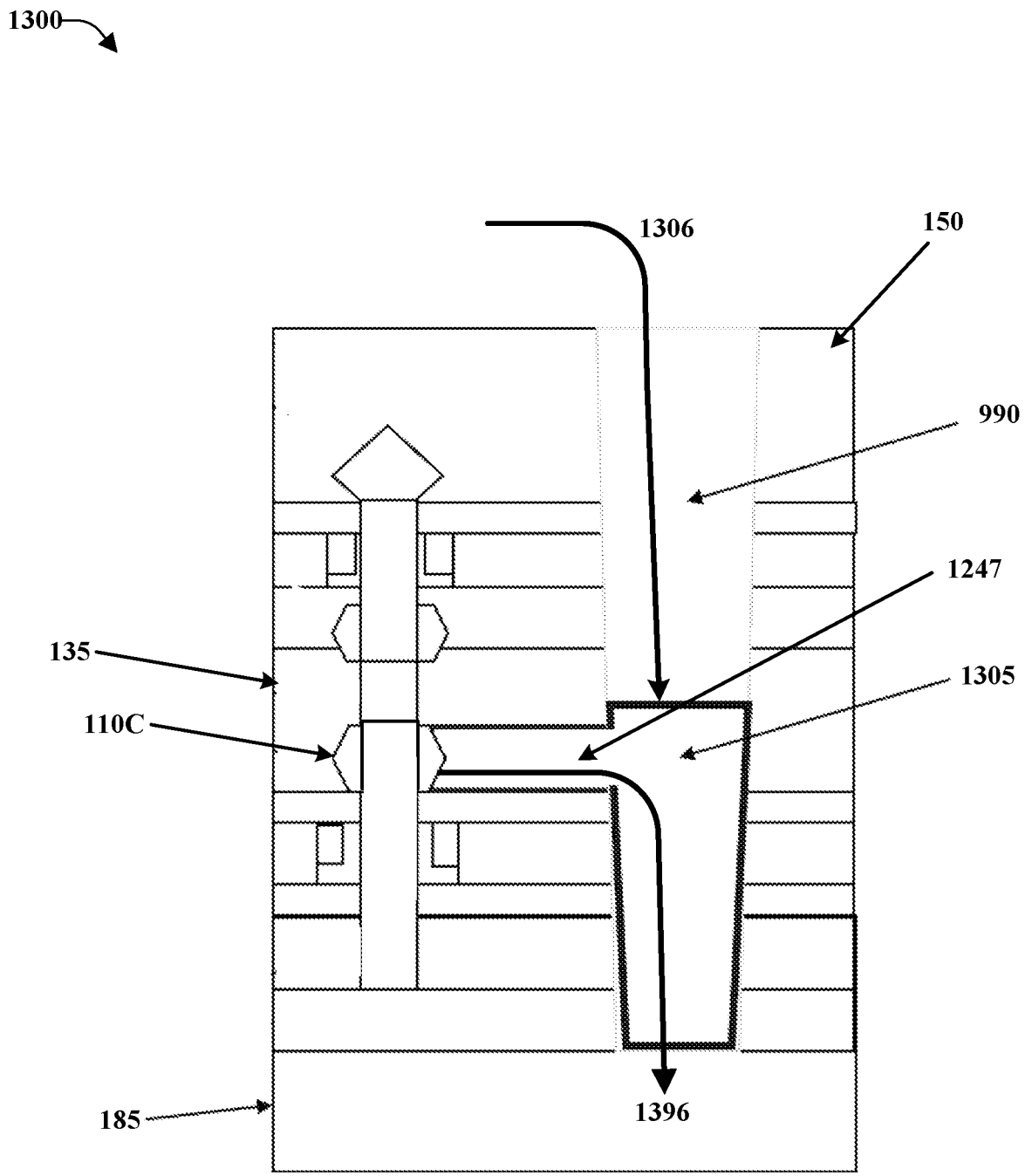
FIG. 13 illustrates an example, non-limiting, fin width cross-sectional view of the semiconductor structure of FIG. 12, during a fabrication stage where the conductive material described in FIG. 12 can be recessed from the via to form a conductive link between the first epitaxial layer of the second VTFET and the substrate layer, in accordance with one or more embodiments described herein.

To enable the connection, in one or more embodiments, during fabrication of semiconductor structure 150, a sacrificial material 847 can be used to take up space for a connective link between the epitaxial layer 110C and a selected position for a via, e.g., via path 810B. As depicted in FIG. 9, when a via is created using via path 810B, it can pass through the sacrificial material 847 and this contact can facilitate the removal of sacrificial material 847 and a connection with epitaxial layer 110C. As depicted in FIG. 11, the removal of the sacrificial material 847 can result in a space between the via and epitaxial layer 110C. As depicted in FIG. 12, during the filling of the via with conductive material, similar to the process described above with FIG. 5, the space left by the removal of the sacrificial material can also be filled with conductive material, channeled from the via. As depicted in FIG. 13, during a recessing of the conductive material filling the via, as described with FIGS. 5-7 above, the conductive material in the space left by the sacrificial material can be left to remain, because this remaining conductive material can provide the connection between the component and the conductive material left to remain in the via after the recessing. As depicted in FIG. 10, similar to the process described above with FIG. 3, As noted above, and described below with FIGS. 8-14, to address the differences between this example and the previous series of embodiments, an approach that employs sacrificial material 847 and an insulator can be used by one or more embodiments. As depicted in FIG. 8, sacrificial material 847 can contact epitaxial layer 110C, e.g., the component that is sought to be electrically coupled with substrate layer 185. Generally speaking, sacrificial material 847 is used to modify the results of the metalization process described above, in accordance with one or more embodiments.

In one or more embodiments, sacrificial material 847 can be relatively positioned with respect to other elements, as depicted in FIG. 8, during fabrication of epitaxial layer 110C of second FET 195. As described with FIG. 1 above, epitaxial layer 110C can be formed by depositing dopant onto first spacer 115C alongside vertical fin channel 175B. One approach to positioning sacrificial material 847 can deposit and form sacrificial material 847 on first spacer 115C along with the deposition of isolation spacer 135 material in this layer. In one or more embodiments, sacrificial material is removed before a metalization of via 990, similar to the metalization of via 390 described above. The removal of sacrificial material 847 is described with FIG. 11 below, along with example materials from which sacrificial material 847 can be composed.

As noted with FIG. 1 above, isolation spacer 135 can be a dielectric material to insulate first FET 190 from second FET 195. Based on the insulating properties of isolation spacer 135 and the example position of via 390 from FIGS. 3-7 above, it is evident that, in this example, a via placed in a similar position as via 390 of FIG. 3 would not come in contact with epitaxial layer 110C in the same fashion that second epitaxial layer 110D came in contact with via 390, e.g., at conductive surface 530 in FIG. 5.

As described in FIG. 9 below, to address the above-noted differences, in this approach, sacrificial material 847 can be placed in a position to contact epitaxial layer 110C and extend across isolation spacer 135 layer, as depicted in FIG. 8.

FIG. 9 illustrates an example, non-limiting, fin width cross-sectional view 900 of the semiconductor structure 150 of FIG. 8, during a fabrication stage where via 990, similar to via 390, can be created from the first surface 155 of semiconductor structure 150 to substrate layer 185 of semiconductor structure 150, the via 990 being created, following via path 810B, through sacrificial material 847 and insulator 848 described above with FIG. 8, in accordance with one or more embodiments described herein. Repetitive description of like elements employed in other embodiments described herein is omitted for sake of brevity.

Created a similar manner and having similar characteristics as via 390 described above, via 990 can be formed by patterning to remove a portion of semiconductor structure 150, e.g., by a directional etching process such as reactive ion etching. As depicted in FIG. 9, via 990 can be an inter-layer recess that starts at the first surface 155 of semiconductor structure 150 and traverses down through first ILD 105A layer, first spacer 115A, second ILD 105B, second spacer 115B, and isolation spacer 135. As described above with FIG. 8, in this example, to enable a connection to be established, e.g., by processes described with FIGS. 10-11 below, sacrificial material 847 was arranged both to contact epitaxial layer 110C and be traversed by via 990 following via path 810B, as depicted in FIG. 9.

Materials selected for use as sacrificial material 847 for one or more embodiments can be subject to removal by processes that do not affect other materials that form other layers of semiconductor structure 150. Examples materials for use as sacrificial material 847 can include, but are not limited to an oxide material such as silicon dioxide.

Continuing to describe the creation of via 990, after traversing sacrificial material 847, first spacer 115C, third ILD 105C, and second spacer 115D are traversed. As described above with FIG. 8, in this example, to prevent interference with the electrical coupling of epitaxial layer 110C and substrate layer 185, insulator 848 can replace a portion of second epitaxial layer 110D.

After second spacer 115D is traversed, insulator 848 is split into two parts, resulting in insulators 955A-B. In one or more embodiments, insulator 955A replaces a portion of second epitaxial layer 110D that would, if a part of the connection between epitaxial layer 110C, cause the interference discussed above. Because insulator 955A is between via 990 and lower epitaxial layer 110D, when a metallic channel is formed, similar to remaining conductive material 605 discussed above, the metallic channel is insulated from lower epitaxial layer 110D.

In one or more embodiments, insulator 848 (split by via 990 into insulators 955A-B) can be generated by employing a shallow trench isolation (STI) process. Example steps of the STI process can include, during an initial fabrication of the semiconductor structure similar to that discussed with FIG. 3 above, using an etching technique to etch a pattern of trenches in a base layer, then depositing one or more dielectric materials to fill the trenches, and removing the excess dielectric.

To illustrate an alternative or additional use of insulator 955B, in some arrangements, interference from an adjacent semiconductor structure can interfere with an electrical coupling facilitated by via 990. To illustrate this example, FIG. 9 includes a portion of adjacent semiconductor structure 980. In an alternative or additional embodiment, semiconductor structure 150 can be adjacent to and contacting adjacent semiconductor structure 980. For this example, to illustrate one approach to using insulator 955B, adjacent semiconductor structure 980 has the same layer structure as semiconductor structure 150, and the layers are aligned with corresponding layers in semiconductor structure 150. Because of this, in this example, second epitaxial layer 950 of adjacent semiconductor structure 980 can potentially generate interference in an electrical coupling facilitated using via 990.

In one or more embodiments, an approach similar to the approach used to insulate via 990 from second epitaxial layer 110D can be used to insulate via 990 from second epitaxial layer 950 of adjacent semiconductor structure 980. For example, like insulator 955A providing insulation from second epitaxial layer 110D, insulator 955B can provide insulation from second epitaxial layer 950.

Completing the example description of the creation of via 990, after traversing insulator 848, via 990 can traverse BOX layer 180, ending at substrate layer 185. It should be noted that different combinations of the same, additional, or fewer layers can also be traversed by via 990 without departing from the spirit of embodiments described herein.

Figure 10:
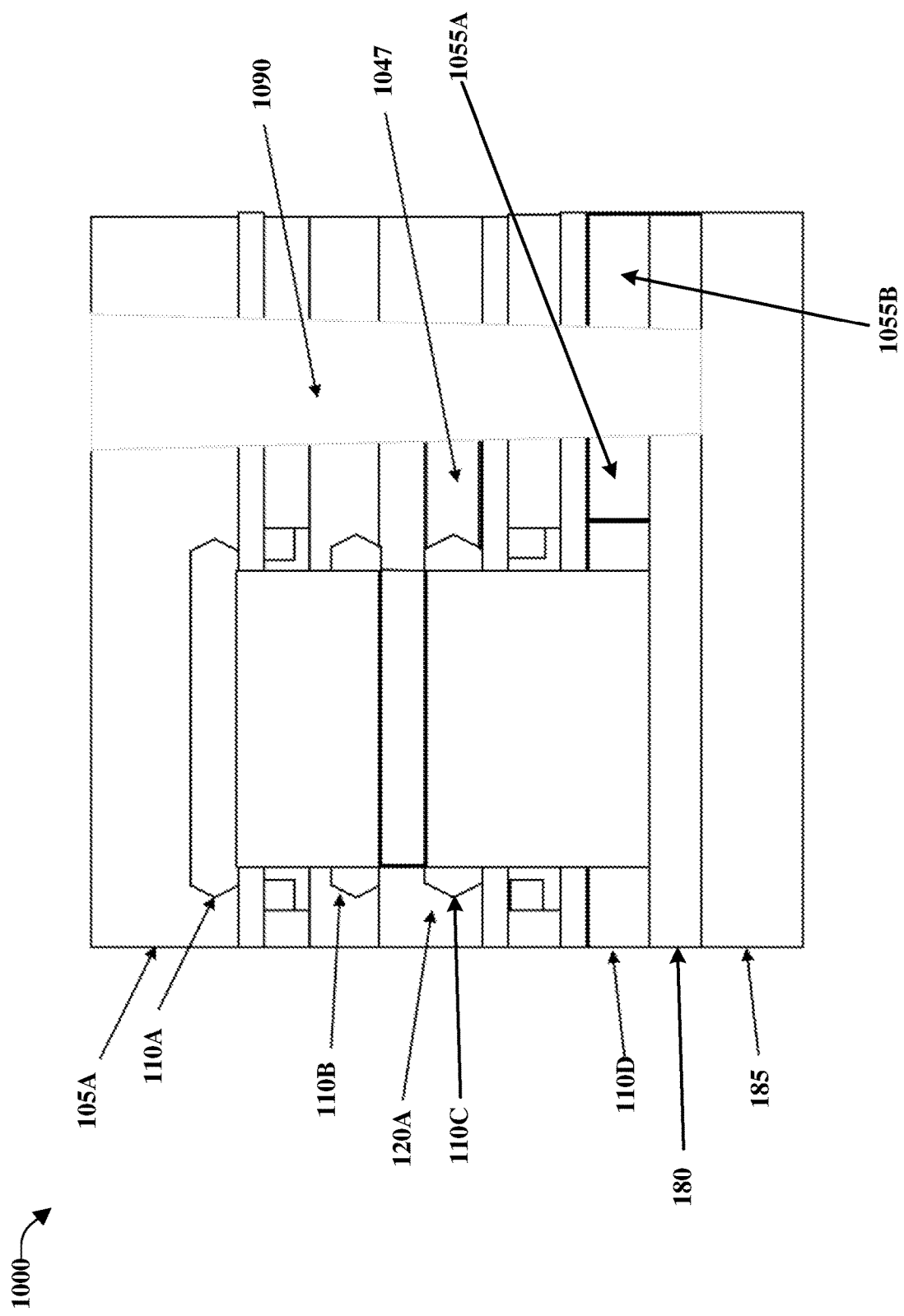
FIG. 10 illustrates an example, non-limiting fin length cross-sectional view of a semiconductor structure similar to the semiconductor structure of FIG. 9, during the fabrication stage described in FIG. 9, in accordance with one or more embodiments described herein.

FIG. 10 illustrates an example, non-limiting fin length cross-sectional view 1000 of semiconductor structure 150 of FIG. 1 in a fabrication stage similar to the stage described with FIG. 9 above, in accordance with one or more embodiments described herein. Repetitive description of like elements employed in other embodiments described herein is omitted for sake of brevity.

In the example depicted in FIG. 10, via 1090 can be placed in a position relative to semiconductor structure 150 that is similar to the relative position of via 490 described with FIG. 4 above. Based on this different positioning, in this example, sacrificial material 1047 can be placed in a different position relative to semiconductor structure 150 than sacrificial material 847 above, e.g., sacrificial material 1047 abutting the shorter side of an example rectangular semiconductor structure 150. Like the different relative placement of via 490 of FIG. 4 above, the arrangement of via 1090 and sacrificial material 1047 do not have any substantial effects on the operation of the embodiments described herein.

FIG. 11 illustrates an example, non-limiting, fin width cross-sectional view 1100 of the semiconductor structure of FIG. 9, during a fabrication stage where sacrificial material 847 can be removed, in accordance with one or more embodiments described herein. Repetitive description of like elements employed in other embodiments described herein is omitted for sake of brevity.

As described in further detail below, in one or more embodiments, after the fabrication stage depicted in FIG. 9 above, sacrificial material 847 of FIG. 9 can contact both epitaxial layer 110C and via 990. After removal of sacrificial material 847, an empty link space 1147 can remain and have conductive material deposited inside with via 990 to provide a link to epitaxial layer 110C, e.g., from processes described with FIG. 12 below.

A non-limiting example of an approach that can be used to remove sacrificial material 847 include etching using a combination of hydrofluoric acid (HF) and sulfuric acid, e.g., when sacrificial material is an oxide, as described in an example above. This combination of hydrofluoric acid (HF) and sulfuric acid can remove sacrificial material 847 while providing a high etch selectivity for materials used to fabricate other layers of semiconductor structure, e.g., non-oxide materials including polysilicon, silicon nitride and metals comprising aluminum.

Once sacrificial material 847 is removed, in one or more embodiments, empty link space 1147 remains, with one end terminating in contact with epitaxial layer 110C and the other end open to via 990.

FIG. 12 illustrates an example, non-limiting, fin width cross-sectional view 1200 of the semiconductor structure of FIG. 11, during a fabrication stage where conductive material 1292 can be deposited into via 990 in a process similar to the process described with FIG. 5 above. Repetitive description of like elements employed in other embodiments described herein is omitted for sake of brevity.

After the fabrication stage described with FIG. 11 above, conductive material 1292 can be deposited within via 990 and empty link space 1147 by a process similar to the process described above with FIG. 5 above. After filling with conductive material, empty link space 1147, in one or more embodiments, can be conductive link 1247.

Example conductive material 1292 that can be used by one or more embodiments for depositing within via 990 and empty link space 1147 include, but not limited to, indium-tin oxide, indium-zinc oxide, aluminum-zinc oxide, titanium, aluminum molybdenum, copper, cobalt, silver, gold, nickel, tungsten, chromium, hafnium, platinum, iron and their alloys.

FIG. 13 illustrates an example, non-limiting, fin width cross-sectional view 1300 of the semiconductor structure of FIG. 12, during a fabrication stage where conductive material 1292 can be recessed 1306 from via 990 to form conductive link 1247 between epitaxial layer 110C and substrate layer 185, in accordance with one or more embodiments described herein.

Figure 14:
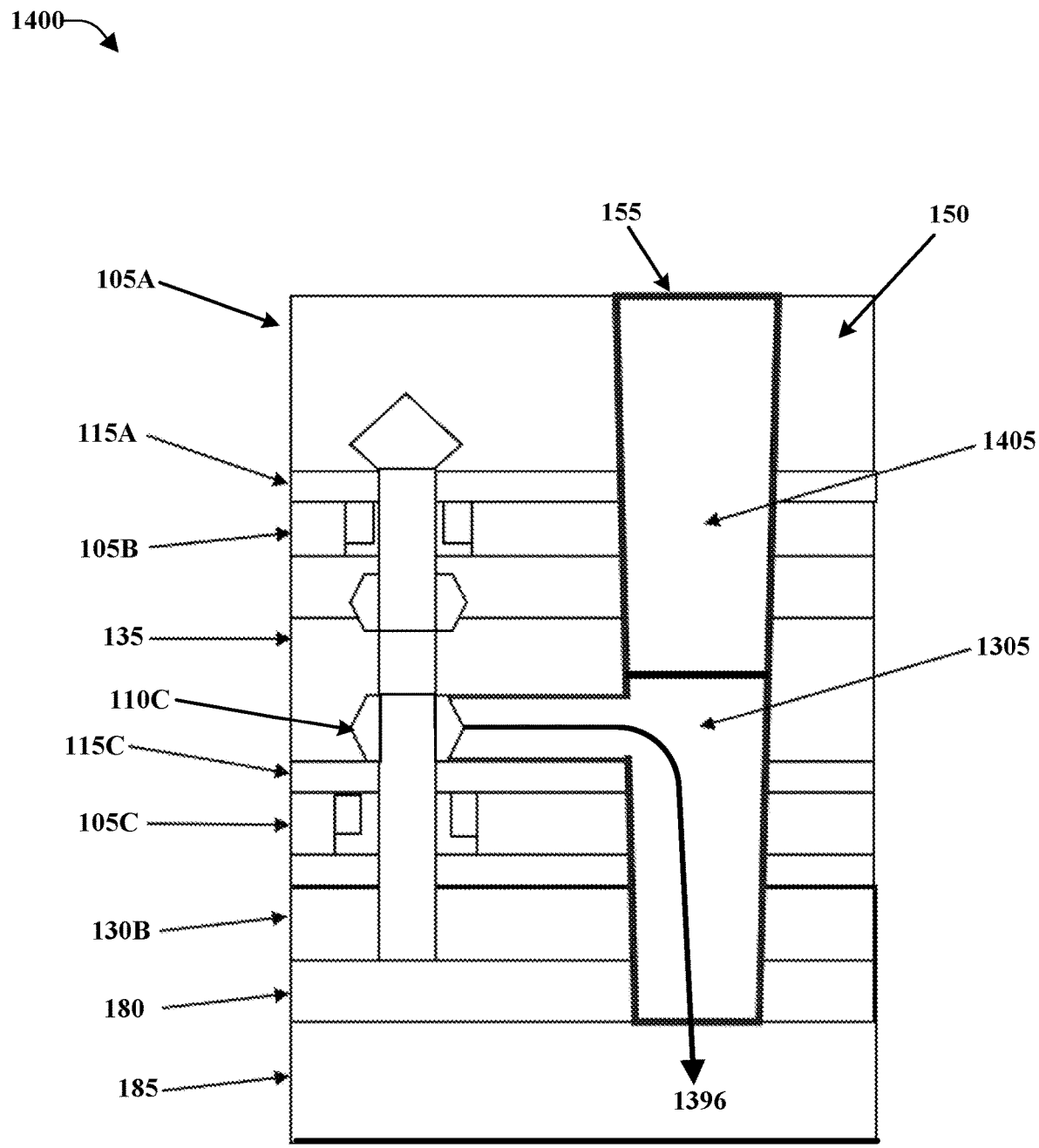
FIG. 14 illustrates an example, non-limiting, fin width cross-sectional view of the semiconductor structure of FIG.

In a recessing 1306 process similar to the process described with FIG. 6 above, conductive material 1292 can be recessed to a point above conductive link 1247 and below second ILD 105B, e.g., adjacent to epitaxial layer 110C as depicted in FIG. 14. In one or more embodiments, remaining conductive material 1305 and conductive link 1247 can form a conductive channel between epitaxial layer 110C and substrate layer 185, e.g., electrically coupling 1396 these layers.

FIG. 14 illustrates an example, non-limiting, fin width cross-sectional view 1400 of semiconductor structure 150 of FIG. 13 during a fabrication stage where dielectric material 1405 can be deposited into empty space left by the recessing 1306 of conductive material 1292, in accordance with one or more embodiments described herein. Repetitive description of like elements employed in other embodiments described herein is omitted for sake of brevity.

In this example, because remaining conductive material 1305 can be subject to interference based on empty space in via 990, in one or more embodiments, dielectric material 1405 can be deposited into via 990 on remaining conductive material 1305 until dielectric material 1405 reaches is substantially to first surface 155 of semiconductor structure 150.

In an alternative embodiment, dielectric material can be deposited into via 990 on remaining conductive material 1305 and continue to be deposited until dielectric material reaches a point where a space is left below first surface 155 of semiconductor structure 150 (not shown). In this embodiment, dielectric material can act as a cap on remaining conductive material 605, such that additional, different types of materials can be deposited on dielectric material 1405 to the first surface 155 of semiconductor structure 150. In an example, this additional material can be a conductor, for example, in contact with dielectric material and other elements of second FET 195, e.g., epitaxial layers of first FET 190 (not shown).

FIG. 15, for a third series of one or more embodiments, illustrates an inverted diagram 1500 of the example, non-limiting, fin width cross-sectional view of semiconductor structure 150 of FIG. 7, after the deposition of dielectric material 705 to fill the empty space above remaining conductive material 605, as described in FIG. 7, in accordance with one or more embodiments described herein. Repetitive description of like elements employed in other embodiments described herein is omitted for sake of brevity.

In this example, after the fabrication stages of FIGS. 1-7 described above, semiconductor structure 150 has lower epitaxial layer 110D electrically coupled with substrate layer 185. As described with FIG. 1 above, in one or more embodiments, the layered stack structure of semiconductor structure 150 can be formed starting with substrate layer 185, and substrate layer 185, being the base layer of semiconductor structure 150 can be characterized as being on the backside of semiconductor structure 150. Thus, in one or more embodiments described above, because substrate layer 185 can be a conductive plane (e.g., a ground or power plane), processes described in the one or more embodiments can facilitate forming a backside ground or power plane in stacked VTFET.

In one or more embodiments described in FIGS. 15-17, after fabrication of semiconductor structure 150 with a substrate layer 185 as a conductive plane, additional fabrication processes can be used to replace substrate 185 with a metallic plane, e.g., facilitating the use of the metallic plane as the conductive plane of semiconductor structure 150. In one or more embodiments, during fabrication, this replacement can be performed because a metallic starting layer may not be usable for certain semiconductor fabrication techniques, but a metallic backside conductive plane is sought for semiconductor design purposes. For example, for some implementations, replacing substrate layer 185 with a metallic layer can provide advantages over non-metallic layers, including, but not limited to protecting semiconductor layers from atmospheric conditions to prevent corrosion, improved heat resistance, and enhanced electrical conductivity.

FIG. 16 illustrates a diagram of the example, non-limiting fin length cross-sectional view 1600 of a semiconductor structure similar to the semiconductor structure of FIG. 15, at a fabrication stage similar to the fabrication stage described in FIG. 15, in accordance with one or more embodiments described herein. Repetitive description of like elements employed in other embodiments described herein is omitted for sake of brevity.

Similar to FIGS. 2, 4, and 10 included above, FIG. 16 is included to depict an example illustrating that semiconductor structure 150 of FIG. 15 above can have lower epitaxial layer 110D and substrate layer 185 electrically connected by employing conductive material 1605 insulated by dielectric 1610, similar to the processes described with FIGS. 7 and 14 above. It should be noted that the processes described with FIG. 17 below can also be employed with the arrangement depicted in FIG. 16.

FIG. 17, illustrates a diagram of the example, non-limiting fin length cross-sectional view 1700 of the semiconductor structure of FIG. 16 during a fabrication stage where a substrate layer 185 of semiconductor structure 150 can be replaced by metallic layer 187, in accordance with one or more embodiments described herein. Repetitive description of like elements employed in other embodiments described herein is omitted for sake of brevity.

In one or more embodiments depicted in FIG. 17, substrate layer 185 can be removed. In this example, substrate layer 185 can be used as a base for fabrication of semiconductor structure 150, and does not require, but can still have, conductive properties as described above with FIGS. 1-16 described above, e.g., conductive properties were required to facilitate substrate layer 185 being a conductive plane, but are not required in this example. Because substrate layer 185 can be removed and replaced in this example, substrate layer 185 can be termed a sacrificial substrate layer 185.

FIG. 17 depicts semiconductor structure 150 after removal of substrate layer 185 to expose BOX layer 180 as the backside of the structure. In one or more embodiments, substrate layer 185 can be removed by thinning down the layer by using processes that include, but are not limited to, using oxidation or chemical mechanical polishing to remove the layer.

In one or more embodiments, metallic plane 187 can replace substrate layer 185 and can be electrically coupled with second epitaxial layer 110D using remaining conductive material 605. Processes for affixing metallic layer 187 to BOX layer 180 include, but are not limited to electroplating or depositing the metallic layer on BOX layer 180.

FIG. 18, illustrates a flow diagram of an example, non-limiting method 1800. Repetitive description of like elements employed in other embodiments described herein is omitted for sake of brevity.

At 1802, the method 1800 can include forming, in a semiconductor structure 150, a first FET 190 vertically stacked (e.g., second surface 163 of first FET 190 is affixed to second FET 195) on a first surface 162 of a second FET 195.

At 1804, the method 1900 can include electrically coupling 796 the second FET 195 to a conductive plane (e.g., substrate layer 185) on a second surface 164 (e.g., on BOX layer 180) of the second FET 195, the second surface 164 being opposite to the first surface 162.

FIG. 19 illustrates a flow diagram of another example, non-limiting method 1900. Repetitive description of like elements employed in other embodiments described herein is omitted for sake of brevity.

At 1902, the method 1800 can include forming, in a semiconductor structure 150, a first FET 190 vertically stacked (e.g., on second surface 163 of first FET 190) on on a first surface 162 of a second FET 195.

At 1904, the method 1900 can include electrically coupling 796 the second FET 195 to a conductive plane (e.g., substrate layer 185) on a second surface 164 (e.g., on BOX layer 180) of the second FET 195, the second surface 164 being opposite to the first surface 162.

At 1906, the method 1900 can include forming a via 390 (e.g., forming via 390 by employing reactive ion etching) in the semiconductor structure 150, wherein the electrically coupling 796 comprises electrically coupling 796 the second FET 195 to the conductive plane (e.g., substrate layer 185) by employing the via 390 (e.g., depositing conductive material 592 into via 390), and wherein the via 390 comprises a recess (e.g., reactive ion etching used to create a recess) in the semiconductor structure 150.

For simplicity of explanation, the methodologies or computer-implemented methodologies are depicted and described as a series of acts. It is to be understood and appreciated that the subject innovation is not limited by the acts illustrated or by the order of acts, for example, acts can occur in various orders or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

FIG. 20 as well as the following discussion are intended to provide a general description of a suitable environment in which the various aspects of the disclosed subject matter can be implemented. FIG. 20 illustrates a block diagram of an example, non-limiting operating environment in which one or more embodiments described herein can be facilitated. Repetitive description of like elements employed in other embodiments described herein is omitted for sake of brevity. With reference to FIG. 20, a suitable operating environment 2000 for implementing various aspects of this disclosure can also include a computer 2012. The computer 2012 can also include a processing unit 2014, a system memory 2016, and a system bus 2018. The system bus 2018 couples system components including, but not limited to, the system memory 2016 to the processing unit 2014. The processing unit 2014 can be any of various available processors. Dual microprocessors and other multiprocessor architectures also can be employed as the processing unit 2014. The system bus 2018 can be any of several types of bus structure(s) including the memory bus or memory controller, a peripheral bus or external bus, or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI). The system memory 2016 can also include volatile memory 2020 and nonvolatile memory 2022. The basic input/output system (BIOS), containing the basic routines to transfer information between elements within the computer 2012, such as during start-up, is stored in nonvolatile memory 2022. By way of illustration, and not limitation, nonvolatile memory 2022 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM)). Volatile memory 2020 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 2012 can also include removable/non-removable, volatile/nonvolatile computer storage media. FIG. 20 illustrates, for example, a disk storage 2024. Disk storage 2024 can also include, but is not limited to, devices like a magnetic disk drive, floppy disk drive, tape drive, Jaz drive, Zip drive, LS-100 drive, flash memory card, or memory stick. The disk storage 2024 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 2024 to the system bus 2018, a removable or non-removable interface is typically used, such as interface 2026. FIG. 20 also depicts software that acts as an intermediary between users and the basic computer resources described in the suitable operating environment 2000. Such software can also include, for example, an operating system 2028. Operating system 2028, which can be stored on disk storage 2024, acts to control and allocate resources of the computer 2012. System applications 2030 take advantage of the management of resources by operating system 2028 through program modules 2032 and program data 2034, e.g., stored either in system memory 2016 or on disk storage 2024. It is to be appreciated that this disclosure can be implemented with various operating systems or combinations of operating systems. A user enters commands or information into the computer 2012 through input device(s) 2036. Input devices 2036 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 2014 through the system bus 2018 via interface port(s) 2038. Interface port(s) 2038 include, for example, a serial port, a parallel port, a game port, and a universal serial bus (USB). Output device(s) 2040 use some of the same type of ports as input device(s) 2036. Thus, for example, a USB port can be used to provide input to computer 2012, and to output information from computer 2012 to an output device 2040. Output adapter 2042 is provided to illustrate that there are some output devices 2040 like monitors, speakers, and printers, among other output devices 2040, which require special adapters. The output adapters 2042 include, by way of illustration and not limitation, video and sound cards that provide a method of connection between the output device 2040 and the system bus 2018. It should be noted that other devices or systems of devices provide both input and output capabilities such as remote computer(s) 2044.

Computer 2012 can operate in a networked environment using logical connections to one or more remote computers, such as remote computer(s) 2044. The remote computer(s) 2044 can be a computer, a server, a router, a network PC, a workstation, a microprocessor based appliance, a peer device or other common network node and the like, and typically can also include many or all of the elements described relative to computer 2012. For purposes of brevity, only a memory storage device 2046 is illustrated with remote computer(s) 2044. Remote computer(s) 2044 is logically connected to computer 2012 through a network interface 2048 and then physically connected via communication connection 2050. Network interface 2048 encompasses wire or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 2050 refers to the hardware/software employed to connect the network interface 2048 to the system bus 2018. While communication connection 2050 is shown for illustrative clarity inside computer 2012, it can also be external to computer 2012. The hardware/software for connection to the network interface 2048 can also include, for exemplary purposes only, internal and external technologies such as, modems including regular telephone grade modems, cable modems and DSL modems, ISDN adapters, and Ethernet cards.

The present invention may be a system, a method, an apparatus or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network or a wireless network. The network can comprise copper transmission cables, optical transmission fibers, wireless transmission, routers, firewalls, switches, gateway computers or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations or block diagrams of methods, apparatus (systems), and computer program products according to embodiments of the invention. It will be understood that each block of the flowchart illustrations or block diagrams, and combinations of blocks in the flowchart illustrations or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create method for implementing the functions/acts specified in the flowchart or block diagram block or blocks. These computer readable program instructions can also be stored in a computer readable storage medium that can direct a computer, a programmable data processing apparatus, or other devices to function in a particular manner, such that the computer readable storage medium having instructions stored therein comprises an article of manufacture including instructions which implement aspects of the function/act specified in the flowchart or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams or flowchart illustration, and combinations of blocks in the block diagrams or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer or computers, those skilled in the art will recognize that this disclosure also can be implemented in combination with other program modules. Generally, program modules include routines, programs, components, data structures, etc. that perform particular tasks or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, or a computer. By way of illustration, both an application running on a server and the server can be a component. One or more components can reside within a process or thread of execution and a component can be localized on one computer or distributed between two or more computers. In another example, respective components can execute from various computer readable media having various data structures stored thereon. The components can communicate via local or remote processes such as in accordance with a signal having one or more data packets (e.g., data from one component interacting with another component in a local system, distributed system, or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other method to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" or "exemplary" are utilized to mean serving as an example, instance, or illustration. For the avoidance of doubt, the subject matter disclosed herein is not limited by such examples. In addition, any aspect or design described herein as an "example" or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," "data storage," "database," and substantially any other information storage component relevant to operation and functionality of a component are utilized to refer to "memory components," entities embodied in a "memory," or components comprising a memory. It is to be appreciated that memory or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
    forming, fully encapsulated within a semiconductor structure in a section view, a first field effect transistor (FET) vertically stacked on a first surface of a second FET, wherein a second surface of the first FET and a third surface of the second FET are each disposed within and are disjoint from a fourth surface of the semiconductor structure, wherein the first FET and the second FET are separated by an insulating layer immediately adjacent between the first FET and the second FET, and wherein the insulating layer is disposed within an isolation spacer; and electrically coupling the second FET to a conductive plane on a second surface of the second FET, the second surface being opposite to the first surface.

2. The method of claim 1, wherein the conductive plane comprises at least one of a ground plane or a power plane.

3. The method of claim 1, wherein the conductive plane is comprised of at least one of a substrate layer or a metallic layer.

4. The method of claim 1, further comprising forming a via in the semiconductor structure, wherein the electrically coupling comprises electrically coupling the second FET to the conductive plane by employing the via, and wherein the via comprises a recess in the semiconductor structure.

5. The method of claim 4, wherein the forming the via comprises forming the via by at least one of etching, metalizing, filling the recess with a recess metal.

6. The method of claim 1, wherein at least one of the first FET or the second FET comprise a vertical transport FET.

7. The method of claim 1, wherein the second FET comprises an epitaxial layer, and wherein the epitaxial layer is electrically coupled to the conductive plane.

* * * * *